United States Patent
Lee et al.

(10) Patent No.: US 9,147,022 B2
(45) Date of Patent: Sep. 29, 2015

(54) METHOD FOR CALCULATING PARAMETER VALUES OF THIN-FILM TRANSISTOR AND APPARATUS FOR PERFORMING THE METHOD

(75) Inventors: Je-Hun Lee, Seoul (KR); Byung-Du Ahn, Hwaseong-si (KR); Sei-Yong Park, Suwon-si (KR); Jun-Hyun Park, Suwon-si (KR); Jae-Woo Park, Seongnam-si (KR); Dae-Hwan Kim, Seongnam-si (KR); Sung-Chul Kim, Gyeongsangnam-do (KR); Yong-Woo Jeon, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 551 days.

(21) Appl. No.: 13/481,579

(22) Filed: May 25, 2012

(65) Prior Publication Data
US 2012/0323542 A1  Dec. 20, 2012

(30) Foreign Application Priority Data
Jun. 16, 2011  (KR) .................. 10-2011-0058546

(51) Int. Cl.
*G06F 7/60* (2006.01)
*G06F 17/10* (2006.01)
*G06F 17/50* (2006.01)

(52) U.S. Cl.
CPC ................ *G06F 17/5036* (2013.01)

(58) Field of Classification Search
CPC .................................... G06F 17/5063
USPC ............................................. 703/2
See application file for complete search history.

(56) References Cited

U.S. PATENT DOCUMENTS

2008/0028342 A1 *  1/2008  Tsuji et al. ............. 716/2

OTHER PUBLICATIONS

Karim Khakzar, Ernst H. Lueder, "Modeling of Amorphous-Silicon Thin-Film Transistors for Circuit Simulations with SPICE", IEEE Transactions on Electronic Devices, vol. 39, No. 6, Jun. 1992, pp. 1428-1434.*

* cited by examiner

*Primary Examiner* — Dwin M Craig
(74) *Attorney, Agent, or Firm* — Innovation Counsel LLP

(57) ABSTRACT

A method for calculating values of parameters of a TFT includes calculating a set of simulated current-voltage (I-V) values using state-density-functions over an entire energy band in a band gap of an amorphous semiconductor of the TFT. The method further includes comparing the set of simulated I-V values with a set of measured I-V values of the TFT to determine a value of a parameter of the TFT. The method may further include calculating values of an acceptor state-density-function $g_A$ using a set of electrostatic capacity-voltage (C-V) values of the TFT measured according to a frequency. The method may further include determining values of a donor state-density-function $g_D$ and values of an interface state-density-function $D_{it}$ over the entire energy band in the band gap.

18 Claims, 29 Drawing Sheets

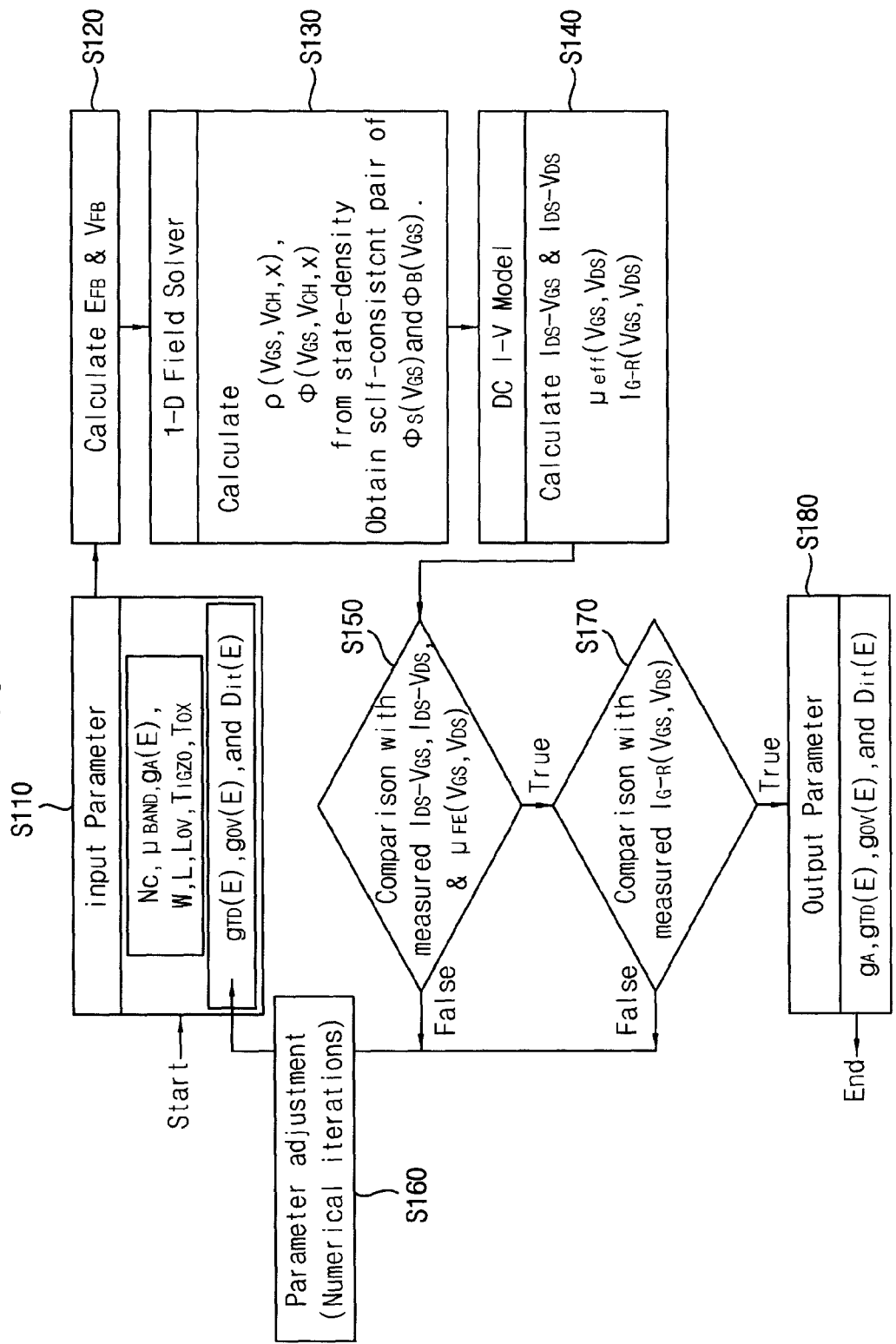

METHOD FOR CALCULATING PARAMETER VALUES OF THIN-FILM TRANSISTOR AND APPARATUS FOR PERFORMING THE METHOD

CROSS-REFERENCE TO RELATED APPLICATION

This application claims priority under 35 U.S.C. §119 to Korean Patent Application No. 2011-58546, filed on Jun. 16, 2011, in the Korean Intellectual Property Office (KIPO), the contents of which are herein incorporated by reference in their entirety.

BACKGROUND OF THE INVENTION

1. Field of the Invention

Example embodiments of the invention relate to a method for calculating parameters of a thin-film transistor (TFT) and a calculating apparatus for performing the method. More particularly, example embodiments of the invention relate to a method for calculating parameters of a TFT including an amorphous semiconductor thin-film and a calculating apparatus for performing the method.

2. Discussion of the Related Art

A crystalline material, such as a metal or a semiconductor, typically has atoms that are regularly arranged to form a crystal. A crystal grain has a diameter from about 0.1 μm to over 0.1 m. In contrast, a non-crystalline or amorphous material has a solid body without a long-range regular arrangement of atoms. Compared with a crystalline material having a solid body with a 3-dimensional regular arrangement of atoms, an amorphous material has a solid body with an irregular arrangement of atoms in a long range. The amorphous material may have an arrangement of atoms similar to that of the crystalline material within a relatively short distance, but the atom arrangement of the amorphous material is disordered in a relatively long distance; therefore, the property of the amorphous material is typically not clearly defined.

For example, metal oxide glass is a typical amorphous material. The glass maintains a disordered structure at a room temperature, without being crystallized when being solidified from a liquid state. The amorphous material, which is a broad definition from the glass, is a generic term for referring to a solid body without a crystalline structure. Cooling a liquid-state metal oxide, such as silicon dioxide ($SiO_2$) or boron trioxide ($B_2O_3$), to make a crystal is difficult, and an amorphous structure may be maintained. In contrast, the metal or the semiconductor is relatively easier to be crystallized, and forming an amorphous structure in the metal or the semiconductor using a conventional method may be difficult. A semiconductor including an amorphous material is an amorphous semiconductor.

A method for forming an amorphous semiconductor has been invented, and the material made from the method has properties different from properties of crystalline semiconductors. Amorphous silicon is a typical amorphous semiconductor. The amorphous silicon has an unclear band structure, and has a state in a band gap; therefore, the amorphous silicon as a semiconductor may be less desirable than a semiconductor with a single crystalline structure. Nevertheless, the amorphous silicon is inexpensive. A p-n junction diode or a transistor conventionally formed using a single crystalline semiconductor may be formed using a hydro-amorphous silicon that is saturated by hydrogen, given that valance electrons may be controlled. In addition, since the amorphous silicon is deposited with a relatively larger size in a relatively lower temperature, the amorphous silicon may be used as a thin-film transistor (TFT) or a visual receptor for an electro photograph; having a relatively large coefficient of light absorption, the amorphous silicon may be used as a solar cell. Recently, the amorphous silicon may be used as a component of a flexible and transparent display apparatus.

As for an amorphous metal oxide semiconductor, a lowest point of a conduction band is located at a metal cation ns orbital; therefore, the mobility of the amorphous metal oxide semiconductor almost reaches band mobility regardless of directions of the crystal, and the state-density is relatively low. Thus, the mobility of the amorphous metal oxide semiconductor is substantially better than an amorphous silicon semiconductor. Given the mobility advantage, the amorphous metal oxide semiconductor may play a significant role in next generation high performance (flexible and transparent) display apparatuses. Despite of the above-mentioned merits, changes of properties of the amorphous metal oxide semiconductor in response to electrical, optical, and thermal stresses are typically difficult to be quantifiably anticipated. To commercialize a display apparatus using an amorphous metal oxide TFT, the changes of the properties of the amorphous metal oxide semiconductor in response to electrical, optical, and thermal stresses should be defined as parameters in an actual pixel operating environment. Given the parameters, the changes of the properties may be simulated to anticipate the performance of the amorphous metal oxide semiconductor in the actual pixel operating environment.

SUMMARY OF THE INVENTION

One or more embodiments of the invention are related a method for calculating values of parameters of a TFT. The method enables simulating properties of an amorphous semiconductor TFT.

One or more embodiments of the invention are related to a calculating apparatus configured for performing the method.

According to an example embodiment of the invention, a method for calculating values of parameters of a TFT includes calculating a set of simulated current-voltage (I-V) values using state-density-functions over an entire energy band in a band gap of an amorphous semiconductor of the TFT. The method further includes comparing the set of simulated I-V values with a set of measured I-V value of the TFT to determine a value of a parameter of the TFT.

In an example embodiment, the method may further include calculating values of an acceptor state-density-function $g_A$ using a set of electrostatic capacity-voltage (C-V) values of the TFT measured according to a frequency of TFT.

In an example embodiment, the method may further include determining values of a donor state-density-function $g_D$ and values of an interface state-density-function $D_{it}$ over the entire energy band in the band gap.

In an example embodiment, the acceptor state-density-function $g_A$ may include an acceptor-like tail state-density-function and an acceptor-like deep state-density-function. The donor state-density-function $g_D$ may include a donor-like tail state-density-function $g_{TD}$ and a shallow donor state-density-function $g_{OV}$. The interface state-density-function $D_{it}$ may include an acceptor-like state-density-function $D_{itA}$ and a donor-like state-density-function $D_{itD}$.

In an example embodiment, in determining the value of the parameter of the TFT, values of a plurality of parameters of the state-density-functions applied for calculating the simulated I-V value may be determined as the values of the parameters of the TFT when the set of simulated I-V value is equal to the set of measured I-V values.

In an example embodiment, in determining the parameter of the TFT, the donor state-density-function $g_D$ and the interface state-density-function $D_{it}$ may be controlled to make the set of simulated I-V values become equal to the set of measured I-V values when the set of simulated I-V values is different from the set of measured I-V values.

In an example embodiment, the method may further include calculating a set of simulated generation-recombination current ($I_{G-R}$) values using the state-density-functions when the set of simulated I-V values is equal to the set of measured I-V values.

In an example embodiment, in determining the value of the parameter of the TFT, values of a plurality of parameters of the state-density-functions applied for calculating the set of simulated $I_{G-R}$ values may be determined as the value of the parameters of the TFT when the set of simulated $I_{G-R}$ values is equal to a set of measured $I_{G-R}$ values.

In an example embodiment, in determining the value of the parameter of the TFT, the donor state-density-function $g_D$ and the interface state-density-function $D_{it}$ may be controlled to make the set of simulated $I_{G-R}$ values become equal to the set of measured $I_{G-R}$ values when the set of simulated $I_{G-R}$ values is different from the set of measured $I_{G-R}$ values.

In an example embodiment, calculating the set of simulated current-voltage (I-V) values includes calculating a flat band voltage ($V_{FB}$) using the state-density-functions in a flat band condition, calculating a density of an electrical charge, an electric field, and an electric potential of the amorphous semiconductor using the flat band voltage, and calculating a subset of simulated I-V values using the density of the electrical charge, the electric field, and the electric potential.

According to an embodiment of the invention, a calculating apparatus for calculating values of parameters of a TFT includes a calculating part and a determining part. The calculating apparatus may further include a non-transitory storage medium storing computer readable code that is configured for performing tasks related to at least one of the calculating part and the determining part. The calculating part calculates a set of simulated I-V values using state-density-functions over the entire energy band in the band gap of an amorphous semiconductor of the TFT. The determining part compares the set of simulated I-V values with a set of measured I-V values of the TFT to determine values of a plurality of parameters of the TFT.

In an example embodiment, the calculating part may calculate values of an acceptor state-density-function $g_A$ using a set if electrostatic capacity-voltage (C-V) values of the TFT measured according to a frequency of TFT.

In an example embodiment, the calculating apparatus may further include a parameter controller determining values of a donor state-density-function $g_D$ and values of an interface state-density-function $D_{it}$ over the entire energy band in the band gap. The calculating part may calculate the set of simulated I-V values using the acceptor state-density-function $g_A$, the donor state-density-function $g_D$, and the interface state-density-function $D_{it}$.

In an example embodiment, the acceptor state-density-function $g_A$ may include an acceptor-like tail state-density-function and an acceptor-like deep state-density-function. The donor state-density-function $g_D$ may include a donor-like tail state-density-function $g_{TD}$ and a shallow donor state-density-function $g_{OV}$. The interface state-density-function $D_{it}$ may include an acceptor-like state-density-function $D_{itA}$ and a donor-like state-density-function $D_{itD}$.

In an example embodiment, the determining part may determine values of a plurality of parameters of the state-density-functions applied for calculating the simulated I-V value as the values of the parameters of the TFT when the set of simulated I-V values is equal to the set of measured I-V values.

In an example embodiment, the parameter controller may control the donor state-density-function $g_D$ and the interface state-density-function $D_{it}$ to make the set of simulated I-V values become equal to the set of measured I-V values when the set of simulated I-V values is different from the set of measured I-V values.

In an example embodiment, the calculating part may calculate a set of simulated $I_{G-R}$ values of the TFT using the state-density-functions when the set of simulated I-V value is equal to the set of measured I-V values.

In an example embodiment, the determining part may determine values of a plurality of parameters of the state-density-functions applied for calculating the set of simulated $I_{G-R}$ values as the value of the parameters of the TFT, when the set of simulated $I_{G-R}$ values is equal to a set of measured $I_{G-R}$ values.

In an example embodiment, the parameter controller may control the donor state-density-function $g_D$ and the interface state-density-function $D_{it}$ to make the set of simulated $I_{G-R}$ values become equal to a set of measured $I_{G-R}$ values when the set of simulated $I_{G-R}$ values is different from the set of measured $I_{G-R}$ values.

In an example embodiment, the calculating part may calculate a flat band voltage ($V_{FB}$) using the state-density-functions in a flat band condition, calculates a density of an electrical charge, an electric field and an electric potential using the flat band voltage ($V_{FB}$). The calculating part may calculate a subset of simulated I-V values using the density of the electrical charge, the electric field and the electric potential.

According to embodiments of the invention, changes of electrical properties of an amorphous semiconductor TFT under electrical, light, and/or thermal stresses may be simulated by calculating values of state-density-functions over an entire energy band in the band gap of the amorphous semiconductor TFT. Thus, values of reliability parameters for the simulation of the amorphous semiconductor TFT may be obtained. The reliability is related to changes of electrical properties of the amorphous semiconductor TFT according to stress duration when the TFT is under an electrical, light, and/or thermal stress. Through simulations with the values of the parameters, circuit properties may be anticipated. Advantageously, TFT manufacturing processes and TFT element structures may be optimized.

BRIEF DESCRIPTION OF THE DRAWINGS

The above and other features of the invention will become more apparent by describing in detail example embodiments thereof with reference to the accompanying drawings, in which:

FIG. 4 is a flow chart illustrating a method of calculating parameters of the TFT using the calculating apparatus in FIG. 1.

DETAILED DESCRIPTION OF EXAMPLE EMBODIMENTS

Various embodiments are described herein below, including methods and techniques. It should be kept in mind that the invention might also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include hardware circuits, dedicated and/or programmable, to carry out operations pertaining to embodiments of the invention. Examples of such apparatus include a general purpose computer and/or a dedicated computing device, including hardware and software, when appropriately programmed and may include a combination of a computer/computing device and dedicated/programmable circuits adapted for the various operations pertaining to embodiments of the invention. Hereinafter, the invention will be explained in detail with reference to the accompanying drawings.

Figure 1:
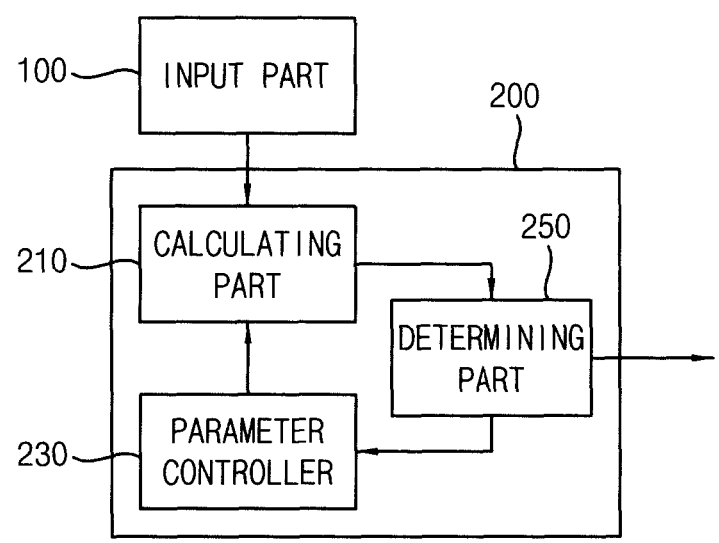
FIG. 1 is a block diagram illustrating a calculating apparatus for calculating parameters of a thin-film transistor (TFT) according to an example embodiment of the invention.

FIG. 1 is a block diagram illustrating a calculating apparatus for calculating parameters of a thin-film transistor (TFT) according to an example embodiment of the invention.

Referring to FIG. 1, the calculating apparatus includes an input part 100 and a parameter calculator 200. The input part 100 is a user interface. The parameter calculator 200 calculates parameters about electrical properties of a thin film transistor (TFT) according to user's input. The parameter calculator 200 includes a calculating part 210, a parameter controller 230, and a determining part 250. The parameter calculator 200 may include a non-transitory storage medium for storing computer readable code related to the calculating part 210, the parameter controller 230, and the determining part 250. The parameter calculator 200 may further include hardware circuits for performing tasks related to the calculating part 210, the parameter controller 230, and the determining part 250.

The calculating part 210 calculates state-density-functions over an entire energy band in the band gap of a semiconductor thin-film which is included in the TFT, using an equation discussed later.

The parameter controller 230 controls parameters of the state-density-functions, using a repeated mathematical algorithm. The parameter controller 230 may control the parameters of the state-density-functions in accordance with a comparison result generated by the determining part 250.

The determining part 250 compares a set of simulated values of an electrical property calculated at the calculating part 210 to a set of measured values of the electrical property. Parameter values that are applied to the state-density-functions are defined as parameter values of the TFT.

For example, the calculating part 210 calculates values of an acceptor state-density-function $g_A$ using a set of measured values of electrostatic capacity-voltage C-V that is measured according to changes of frequency of TFT. The acceptor state-density-function $g_A$ may include an acceptor-like tail state-density-function and an acceptor-like deep state-density-function.

The parameter controller 230 sets parameter values of a donor state-density-function $g_D$ over the entire energy band in the band gap, and parameter values of an interface state-density-function $D_{it}$ to a set of initial values. The donor state-density-function $g_D$ may include a donor-like tail state-density-function $g_{TD}$ and a shallow donor state-density-function $g_{OV}$. The interface state-density-function $D_{it}$ may include an acceptor-like interface state-density-function $D_{itA}$ and a donor-like interface state-density-function $D_{itD}$.

The calculating part 210 calculates a set of simulated values of current-voltage I-V using the parameter values of the donor state-density-function $g_D$ and the parameter values of the interface state-density-function $D_{it}$. The calculating part 210 calculates a flat band voltage $V_{FB}$ in a flat band condition using the state-density-functions. The calculating part 210 calculates charge density ρ, electric field E, and electric potential φ of the TFT using the flat band voltage $V_{FB}$, and calculates a subset or the set of simulated values of current-voltage I-V using the charge density ρ, the electric field E, and the electric potential φ.

The determining part 250 compares the set of simulated values of current-voltage I-V with a set of measured values of current-voltage I-V. If the set of simulated values is equal to the set of measured values, the calculating part 210 calculates a set of simulated values of a generation-recombination current $I_{G-R}$ using the state-density-functions $g_A$, $g_D$, and $D_{it}$.

The determining part 250 compares the set of simulated values of a generation-recombination current $I_{G-R}$ with a set of measured values of the generation-recombination current $I_{G-R}$. If the set of simulated values is equal to the set of measured values, values of a plurality of parameters of the state-density-functions $g_A$, $g_D$, and $D_{it}$ that are applied to calculate the simulated value of the generation-recombination current $I_{G-R}$ are defined as the value of the parameters of the TFT.

If the set of simulated values of current-voltage I-V is not equal to the set of measured values of current-voltage I-V, the parameters controller 230 controls the parameters of the donor state-density-function $g_D$ and the parameters of the interface state-density-function $D_{it}$ so that the set of simulated values becomes equal to the set of measured values. In addition, if the set of simulated values of generation-recombination current $I_{G-R}$ is not equal to the set of measured value of generation-recombination current $I_{G-R}$, the parameter controller 230 controls the parameters of the donor state-density-function $g_D$ and the parameters of the interface state-density-function $D_{it}$ so that the set of simulated values becomes equal to the set of measured values.

Figure 2:
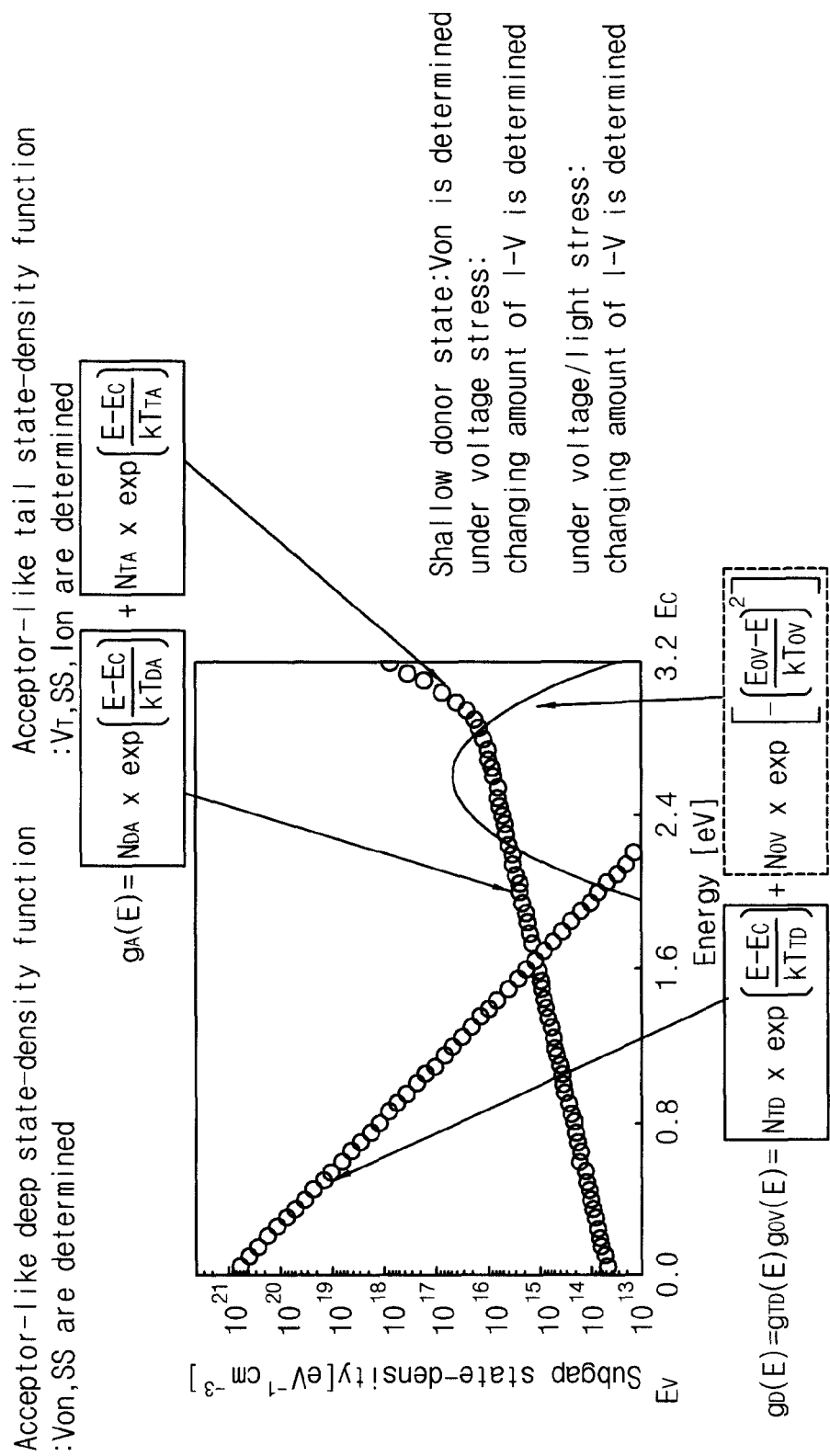
FIG. 2 is a graph illustrating state-density-functions in an entire energy band in a band gap of an amorphous semiconductor TFT.
Figure 3:
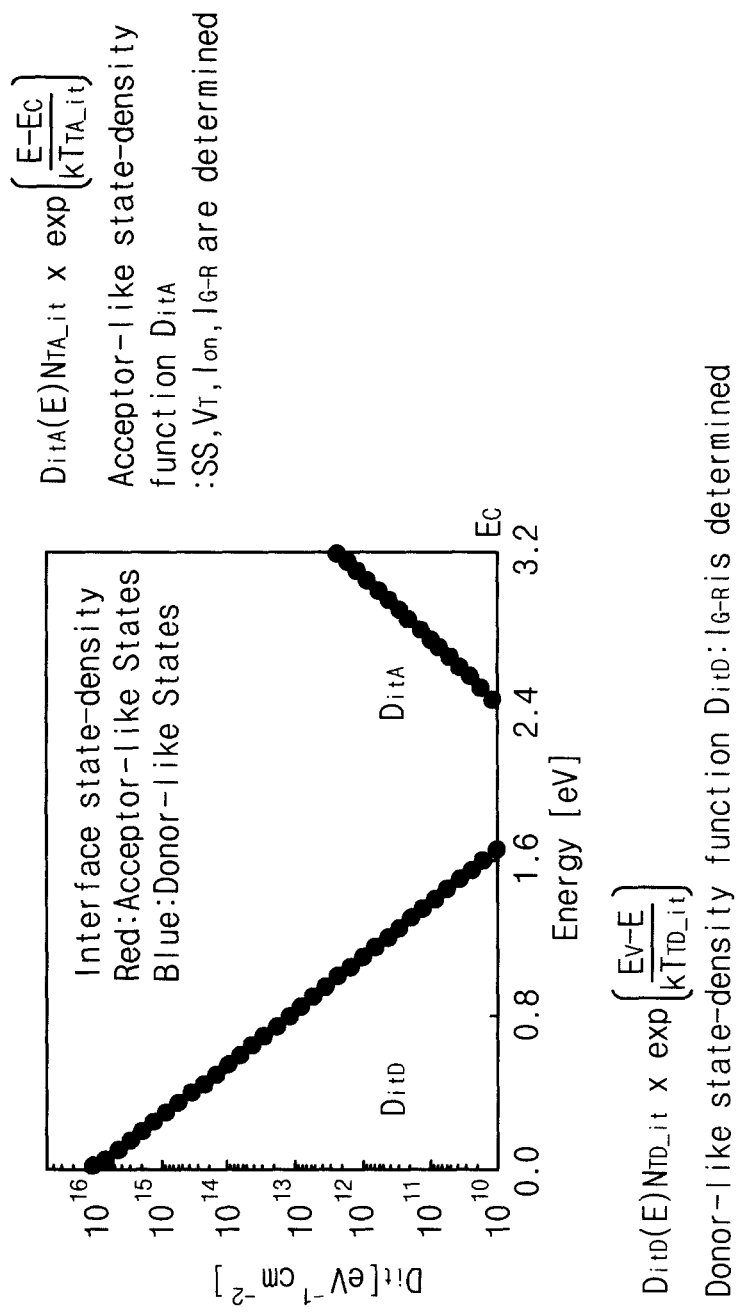
FIG. 3 is a graph illustrating an interfacial state-density-function in the entire energy band in the band gap of the amorphous semiconductor TFT.

FIG. 2 is a graph illustrating state-density-functions in an entire energy band in a band gap of an amorphous semiconductor TFT. FIG. 3 is a graph illustrating an interfacial state-density-function in the entire energy band in the band gap of the amorphous semiconductor TFT. Ion is a current when the TFT is turned on.

Referring to FIGS. 2 and 3, the donor-like tail state-density-function $g_{TD}$ causes changes of properties of the TFT due to a charge detrapping when voltage/light stress is applied, and recovers in a relatively long term. However, the shallow donor state-density-function $g_{OV}$ causes changes of properties of the TFT due to a chemical weak bond-breaking when a voltage and/or light stress is applied, and recovers in a short term. Thus, when voltage stress is applied without the light stress, the properties of the TFT are mainly changed due to changes of the shallow donor state-density-function $g_{OV}$.

State-density-functions over the entire energy band in the band gap of an amorphous semiconductor are assorted into an acceptor state-density-function $g_A$ including an acceptor-like tail state-density-function and acceptor-like deep state-density-function, and the donor state-density-function $g_D$ including the donor-like tail state-density-function $g_{TD}$ and the shallow donor state-density-function $g_{OV}$. In addition, the interface state-density-function $D_{it}$ is assorted into the acceptor-like state-density-function $D_{itA}$ and the donor-like state-density-function $D_{itD}$.

The acceptor-like deep state-density-function may decide an on-voltage Von and a sub-threshold slope region SS. The sub-threshold slope region SS is an area between the on-voltage Von and a critical voltage $V_T$. The acceptor-like deep state-density-function may decide the critical voltage $V_T$, the sub-threshold slope region SS and the on-voltage Von. The donor-like tail state-density-function $g_{TD}$ may decide the generation-recombination current $I_{G-R}$. The shallow donor state-density-function $g_{OV}$ may decide the on-voltage Von, decide a changing amount of the current-voltage I-V when voltage stress is applied, and decide a changing amount of the current-voltage I-V when voltage/light stress is applied.

As illustrated in FIGS. 2 and 3, particular parameters are related to the current-voltage I-V properties of the amorphous semiconductor TFT, and are also related to changes of the current-voltage I-V under a voltage and/or light stress. Thus, the current-voltage I-V property of the TFT is simulated using the state-density-functions to make a measured current-voltage I-V property equal to the simulated value, so that a final state-density-function may be calculated by the parameters reproducing the current-voltage I-V properties.

In one or more embodiments, it is important that parameters corresponding to the state-density-functions can be uniquely decided. As illustrated in FIGS. 2 and 3, each of the parameters independently influences corresponding current-voltage I-V properties, so that the parameters corresponding to the state-density-functions are uniquely decided by reproducing measured current-voltage I-V properties in various ranges. In one or more embodiments, a computer and/or a calculator may be used to get a unique solution.

FIG. 4 is a flow chart illustrating a method of calculating parameters of the TFT according to the calculating apparatus in FIG. 1.

First, values of parameters about a structure of the TFT (for example, channel width W, channel length L, length of source and drain electrodes Lov overlapping a channel, thickness of an amorphous semiconductor $T_{IGZO}$, thickness of a gate insulation layer Tox, etc.) and values of parameters obtained by measuring (for example, carrier concentration in the conduction band $N_C$, carrier mobility in the conduction band μBand, etc.) are inputted (step S110). In addition, values of parameters of the acceptor state-density-function $g_A$ may be inputted in the calculating apparatus.

The acceptor state-density-function $g_A$ is supposed to be measured through an experiment. For example, a calculating method using frequency-dependent current-voltage I-V properties of TFT may be used (IEEE Electron Devices Lett., vol. 31, no. 3, pp. 231-233, March, 2010). Values of the acceptor state-density-function $g_A$ are calculated as illustrated in FIG. 5A to 5C.

Figure 5A:
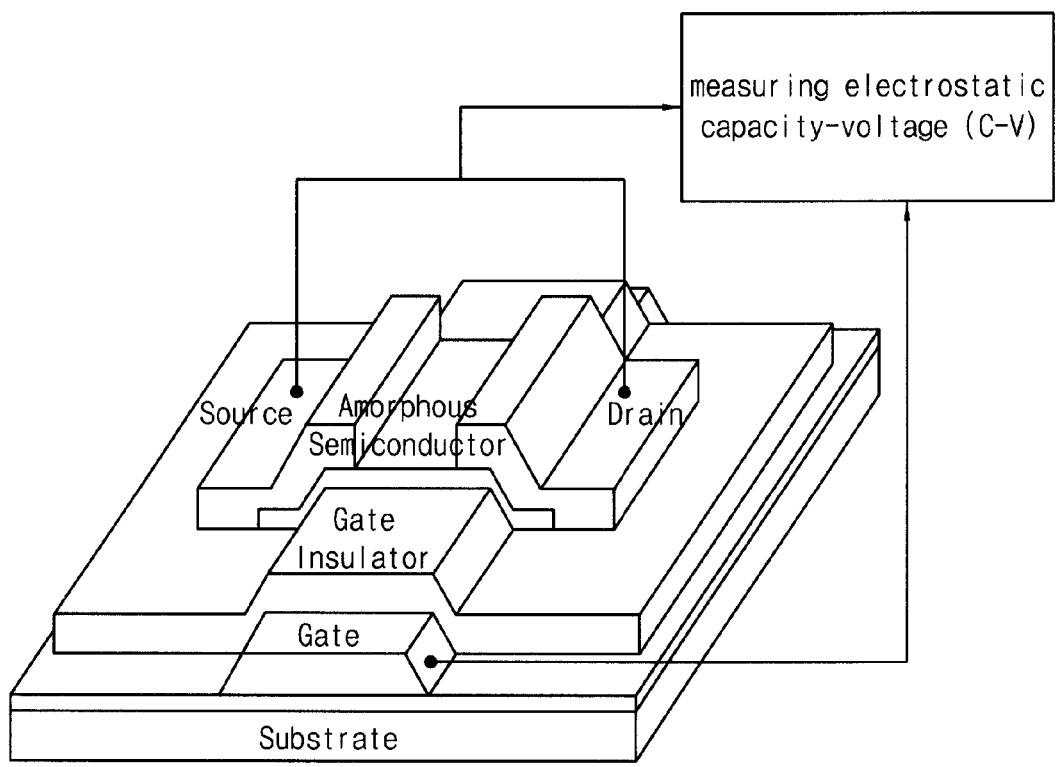
FIG. 5A is a conceptual diagram illustrating a method of measuring C-V properties to calculate an acceptor state-density-function $g_A$ adjacent to a conduction band of the amorphous semiconductor TFT.

FIG. 5A is a conceptual diagram illustrating a method of measuring C-V properties to calculate an acceptor state-density-function $g_A$ adjacent to a conduction band of the amorphous semiconductor TFT. FIG. 5B is a graph illustrating the C-V properties according to a frequency to calculate the acceptor state-density-function $g_A$ adjacent to the conduction band of the amorphous semiconductor TFT. FIG. 5C is a graph illustrating the acceptor state-density-function $g_A$ adjacent to the conduction band of the amorphous semiconductor TFT.

Figure 5B:
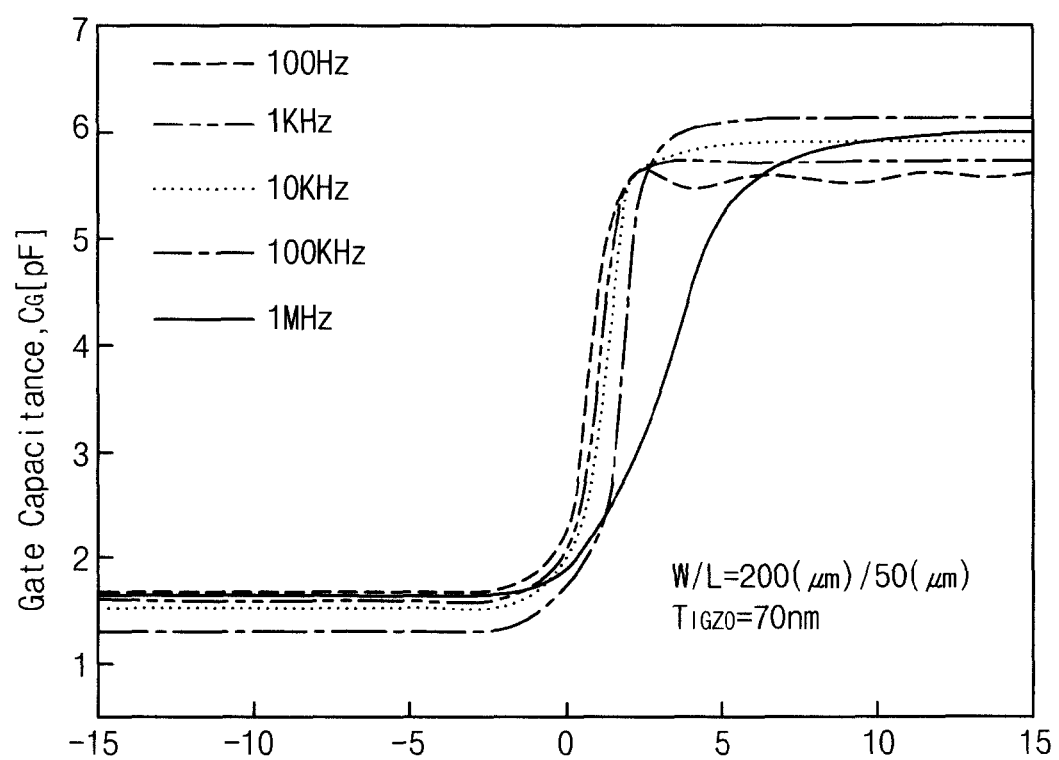
FIG. 5B is a graph illustrating the C-V properties according to a frequency to calculate the acceptor state-density-function $g_A$ adjacent to the conduction band of the amorphous semiconductor TFT.
Figure 5C:
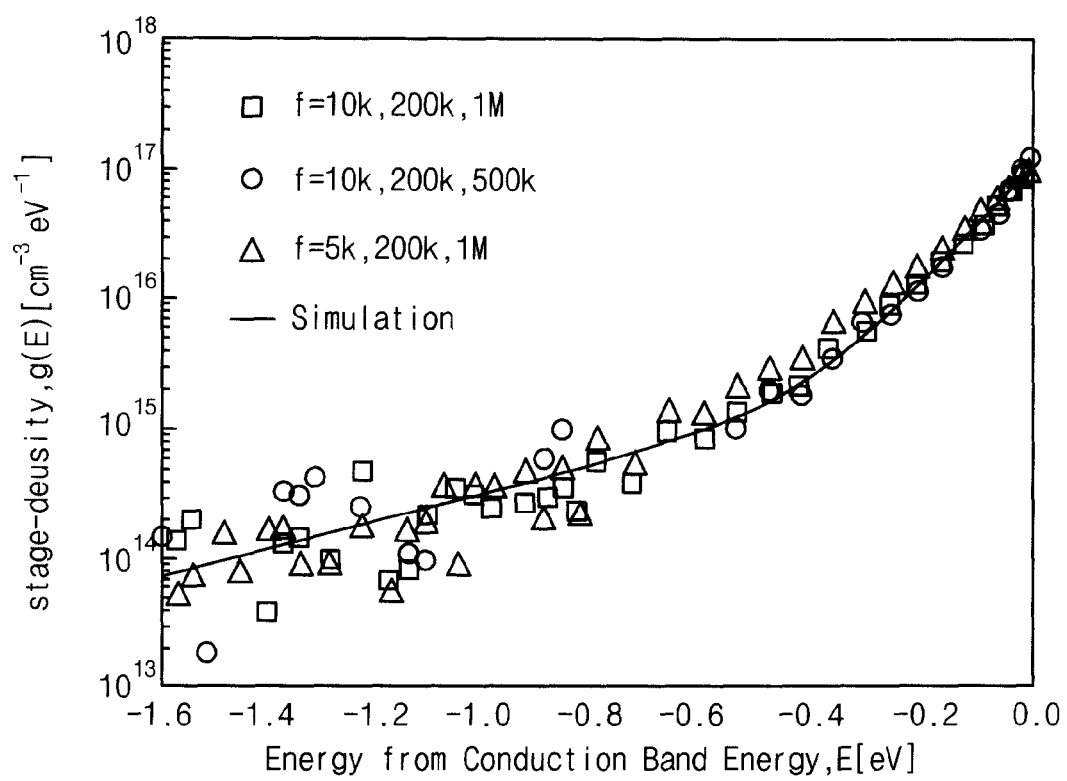
FIG. 5C is a graph illustrating the acceptor state-density-function $g_A$ adjacent to the conduction band of the amorphous semiconductor TFT.

The acceptor state-density-function $g_A$ may be calculated using a method similar to that illustrated in FIGS. 5A to 5C. As illustrated in FIGS. 5A to 5C, the acceptor state-density-function $g_A$ may be calculated using a measured value of electrostatic capacity-voltage C-V at the calculating part 210 according to the present example embodiment. Alternatively, parameters of the acceptor state-density-function $g_A$ may be inputted through the input part 100.

In addition, in step S110 illustrated in FIG. 4, the parameter controller 230 may provide initial values (e.g., based on assumptions) for the state-density-functions $g_{TD}$, $g_{OV}$, and $D_{it}$ over the entire energy band, and the values are inputted.

In step S120, using the values of the state-density-functions $g_{TD}$, $g_{OV}$, and $D_{it}$, an $E_{FB}$ (a difference between a lowest energy level in a conduction band $E_C$ and a Fermi level $E_F$) in the flat band condition and the flat band voltage $V_{FB}$ are calculated according to at least Equation 1 and Equation 2.

$$\int_{E_V}^{E_C} g_{ov}(E)dE + \int_{E_V}^{E_C} g_{TD}(E)[1-f(E)]dE - \int_{E_V}^{E_C} g_A(E)f(E)dE - n_{free}(E_F) = 0 \qquad \text{[Equation 1]}$$

$$V_{FB} = \phi_{Mo-IGZO} + \frac{Q_{ox}}{C_{ox}} +, \qquad \text{[Equation 2]}$$

$$\phi_{Mo-IGZO} = (\chi_{Mo} - \chi_{IGZO}) - E_{FB}/q$$

In Equations 1 and 2, $E_C$ and $E_V$ respectively indicate the lowest level in the conduction band and a highest level, nfree indicates concentration of free electron carriers, $\phi$ and $\chi$ respectively indicate work function and electron affinity, q indicate s charge of an electron, Qox indicate s charge at an unit area in the gate insulation layer, and Cox indicate s electrostatic capacity at an unit area in the gate insulation layer.

Concentration of free electron carriers, nfree, and concentration of free electron carriers at a unit area, Qfree, are calculated using Equation 3, and thus are functions of parameters of state-density-functions.

$$n_{free}(x, V_{CH}(y)) = \frac{2}{\sqrt{\pi}} N_C F_{1/2}(\eta_F)$$ [Equation 3]

$$F_{1/2}(\eta_F) = \int_0^\infty \frac{\sqrt{\eta}}{1 + \exp(\eta - \eta_F)} d\eta$$

$$\eta_F(x, V_{CH}(y)) = \frac{q\phi(x) - E_{FB} + qV_{CH}(y)}{kT}$$

$$f(E) = \frac{1}{1 + \exp\left(\frac{E - (E_C - E_{FB} + q\phi(x) - qV_{CH}(y))}{kT}\right)}$$

$$Q_{free}(x, V_{CH}(y)) = q\int_{x=x}^{x=T_{IGZO}} n_{free}(x, V_{CH}(y))dx$$

$$= q\int_{x=x}^{x=T_{IGZO}} \frac{2}{\sqrt{\pi}} N_C F_{1/2}(\eta_F) dx$$

In Equation 3, $F_{1/2}$ indicates Fermi-Dirac integral equation, and f(E) indicates Fermi-Dirac distribution function.

Figure 6:
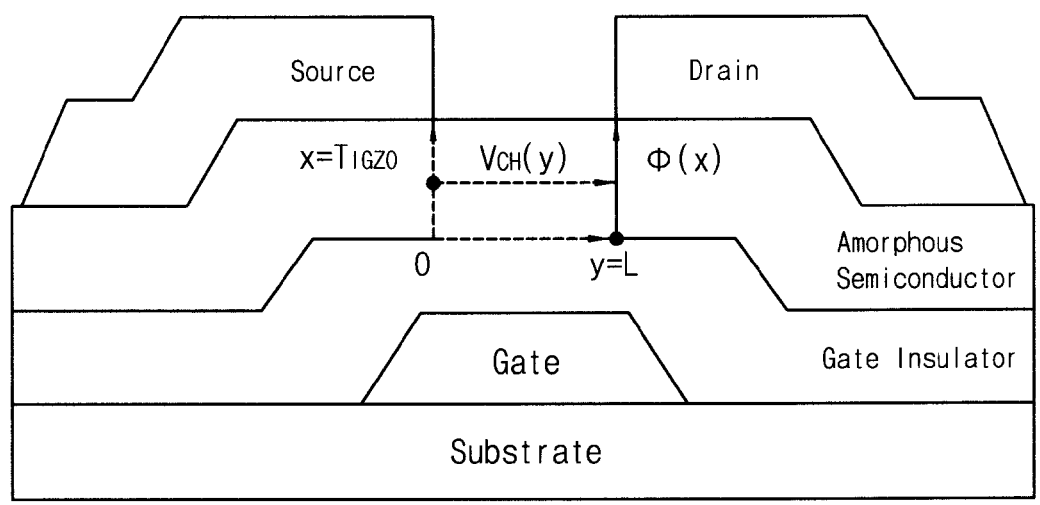
FIG. 6 is a conceptual diagram illustrating the amorphous semiconductor TFT.

FIG. 6 is a conceptual diagram illustrating the amorphous semiconductor TFT discussed above. Referring FIG. 6, x and y respectively indicate a perpendicular direction and a horizontal direction of the TFT, for representing spatial coordinates. $T_{IGZO}$ and L respectively indicate thickness and channel length of the amorphous semiconductor. In addition, $\Phi(x)$ indicates an internal electric potential of the amorphous semiconductor along a depth direction, and $V_{CR}(y)$ indicates an internal electric potential of the amorphous semiconductor along a channel length direction.

In addition, in the amorphous semiconductor, a localized trapped charge density $Q_{loc}$ exists in accordance with the amount of electrons distributed in the donor-like tail state-density-function $g_{TD}$ and the acceptor state-density-function $g_A$. The localized trapped charge density $Q_{loc}$ may be calculated using parameters of the state-density-functions as illustrated by Equation 4.

$$n_{loc}(x, V_{CH}(y)) = \int_{E_V}^{E_C} g_{TD}(E)[1-f(E)]dE - \int_{E_V}^{E_C} g_A(E)f(E)dE$$

$$Q_{loc}(x, V_{CH}(y)) = q\int_{x=x}^{x=T_{IGZO}} n_{loc}(x, V_{CH}(y))dx = q\int_{x=x}^{x=T_{IGZO}} [\int_{E_V}^{E_C} g_{TD}(E)[1-f(E)]dE - \int_{E_V}^{E_C} g_A(E)f(E)dE]dx$$ [Equation 4]

In addition, the shallow donor state-density-function $g_{OV}$ exists as an electric charge having positive value, so that the charge density at a unit area $Q_{OV}$ may be calculated using Equation 5, for example, given oxygen vacancy or hydrogen.

$$Q_{OV} = q\int_{x=x}^{x=T_{IGZO}} (\int_{E_V}^{E_C} g_{OV}(E)dE)dx$$ [Equation 5]

In addition, an electron or hole at a gate oxide film and an amorphous semiconductor interface is considered as $Q_{it}$, which is calculated using Equation 6.

$$Q_{it}(y) = q\int_{E_V}^{E_C}(D_{itD}(E)\times[1-f(E)]-D_{itA}(E)\times f(E))dE$$
$$[C \cdot cm^{-2}]$$ [Equation 6]

Thus, the entire charge density inside of the amorphous semiconductor and at an interface of the amorphous semiconductor may be represented as parameters of state-density-functions, for using the charge density as a space charge density, Poisson's equation such as Equation 7 may be obtained for the amorphous semiconductor TFT.

$$\frac{\partial^2 \phi(x)}{\partial x^2} = \frac{q}{\varepsilon_{IGZO}}\left[n_{loc}(x, V_{CH}(y)) + n_{free}(x, V_{CH}(y)) - \int_{E_V}^{E_C} g_{OV}(E)dE\right]$$ [Equation 7]

$$V_{GS} = V_{FB} + \phi_s + \frac{Q_{loc}(x=0) + Q_{free}(x=0) + Q_{OV}(x=0) + Q_{it}}{C_{ox}}\bigg|_{y=constant}$$ [Equation 8]

$$= V_{FB} + \phi_s + \frac{\varepsilon_{IGZO} \times E_{IGZO}(x=0) + Q_{it}}{C_{ox}}\bigg|_{y=constant}$$

Correlations related to a gate to source voltage $V_{GS}$, a charge density $\rho$, and a surface potential $\phi s$ may be represented in Equation 8. Thus, the charge density p, the electric field E, and the electric potential $\phi$ inside of the amorphous semiconductor TFT are respectively represented as functions of $V_{GS}$, $V_{CH}(y)$, and x, so that $\phi(x)$, which indicates an energy band chart, may be obtained as a function of $V_{GS}$ in step S130 illustrated in FIG. 4.

In addition, a drain to source current, which is a function of $g_{TD}$, $g_{OV}$ and $D_{it}$ parameters, is represented as Equation 9, so that the current may be calculated in step S140 illustrated in FIG. 4.

[Equation 9]

$$I_{DS} = q\mu_{Band}\frac{W}{L}\int_{V_S}^{V_S+V_D}\int_{x=0}^{x=T_{IGZO}} \frac{Q_{free}(x,y)}{Q_{free}(x,y) + Q_{loc}(x,y)} \times n_{free}(x, V_{CH}(y))dx\, dV_{CH}(y)$$

$$= q\mu_{Band}\frac{W}{L}\int_{V_S}^{V_S+V_D}\int_{\phi_B}^{\phi_S} \frac{q\int_{\phi_B}^{\phi(x)} \frac{n_{free}(\phi, V_{CH}(y))}{E_{IGZO}(\phi, V_{CH}(y))}d\phi}{Q_{free}(\phi, V_{CH}(y)) + Q_{loc}(\phi, V_{CH}(y))} \times \frac{n_{free}(\phi, V_{CH}(y))}{E_{IGZO}(\phi, V_{CH}(y))}d\phi\, dV_{CH}(y)$$

A drain current property calculated as a function of $V_{GS}$ and $V_{DS}$ is compared to a measured I-V property curve of the TFT (both a transition curve and an output curve) in step S150.

If the set of calculated simulated values is not equal to the corresponding set of measured values in the measured I-V properties curve, the parameter controller 230 changes the parameter values of the state-density-functions $g_{TD}$, $g_{OV}$, and $D_{it}$ in step S160. The steps S110 to S160 are repeated until the set of calculated simulated values is equal to the set of measured value in the measured I-V properties curve.

In step S150, if the set of measured I-V values is equal to the set of calculated simulated values, a set of calculated simulated values of the generation-recombination current $I_{G-R}$ is compared to a set of measured values of the generation-recombination current $I_{G-R}$ using the parameters of the state-density-functions $g_{TD}$, $g_{OV}$ and $D_{it}$ in step S170.

Figure 7A:
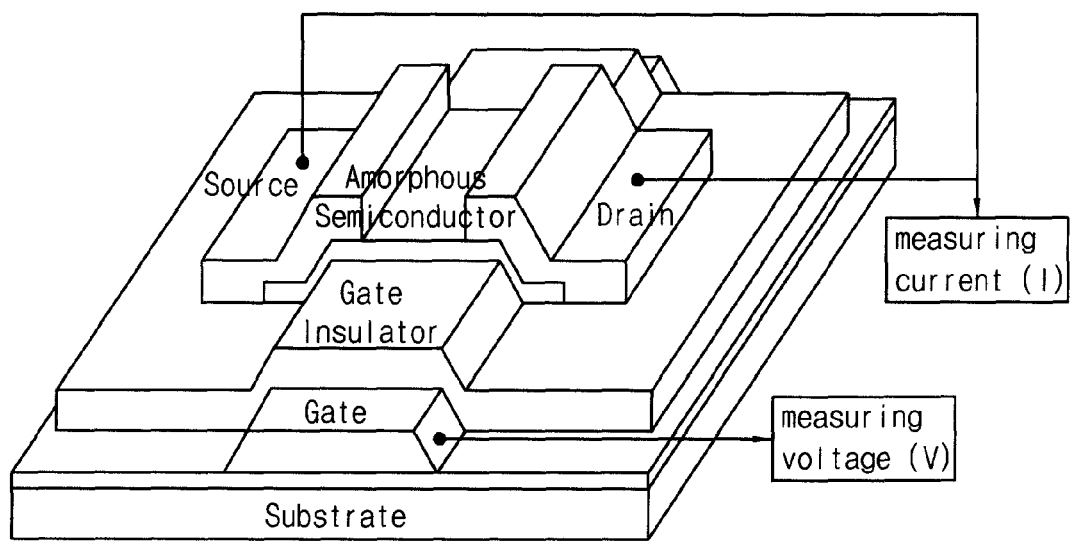
FIG. 7A is a conceptual diagram illustrating a method of measuring a generation-recombination current of the amorphous semiconductor TFT.
Figure 7B:
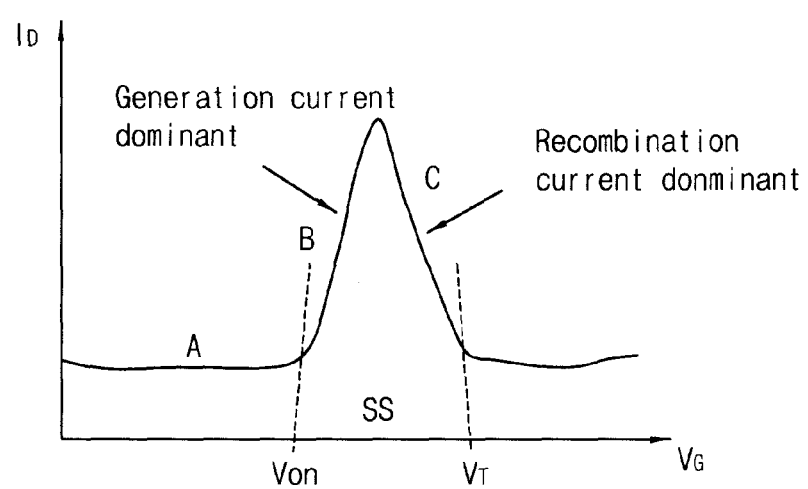
FIG. 7B is a graph illustrating a measured result of the generation-recombination current $I_{G-R}$ according to the method in FIG. 7A.
Figure 7C:
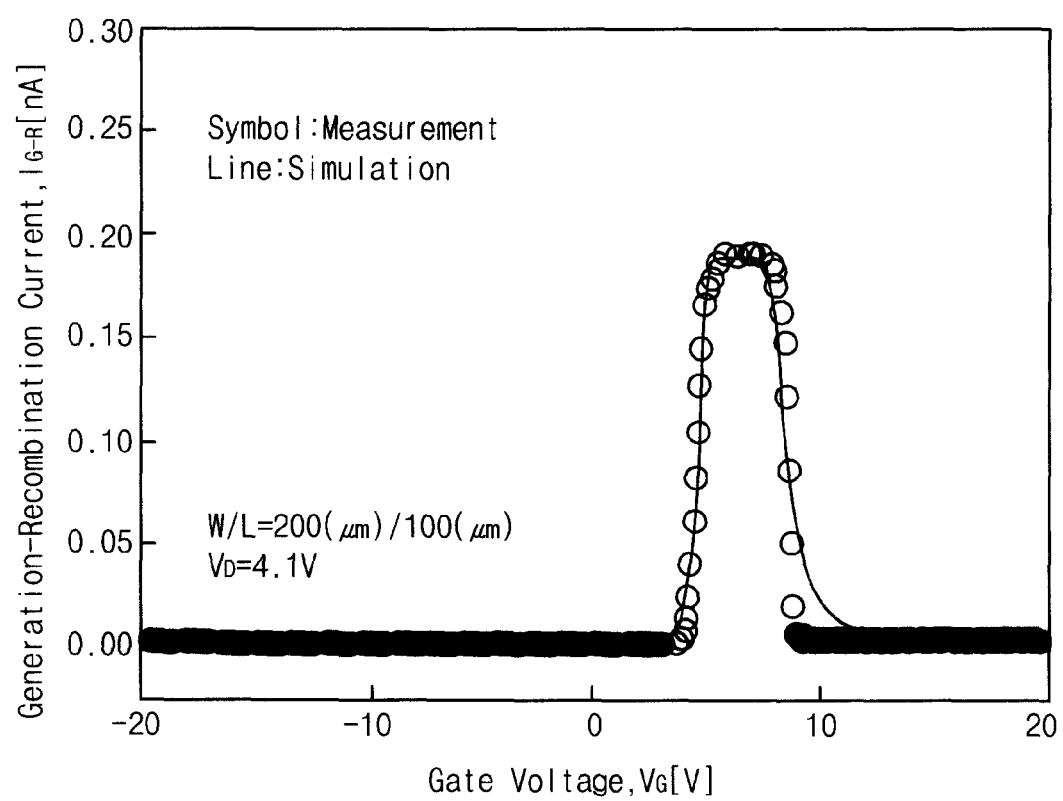
FIG. 7C is a graph illustrating a result of parameters by combining a calculated generation-recombination current $I_{G-R}$ calculated by the calculating apparatus in FIG. 1 with the measured generation-recombination current $I_{G-R}$.

FIG. 7A is a conceptual diagram illustrating a method of measuring a generation-recombination current of the amorphous semiconductor TFT. FIG. 7B is a graph illustrating a measured result of the generation-recombination current $I_{G-R}$ according to the method in FIG. 7A. FIG. 7C is a graph illustrating a result of parameters by combining a set of calculated values of generation-recombination current $I_{G-R}$ calculated by the calculating apparatus in FIG. 1 with the set of measured values of generation-recombination current $I_{G-R}$.

The generation-recombination current $I_{G-R}$ of the amorphous semiconductor TFT may be calculated according to Equations 10 to 16, using parameters of the state-density-functions.

simulated values of $I_{G-R}$, the parameter values of the state-density-functions $g_A$, $g_{TD}$, $g_{OV}$, and $D_{it}$ are extracted as final parameter values of the amorphous semiconductor TFT. in step S180. $I_{DS}$ is a drain to source current.

Hereinafter, calculated results of the state-density-functions in an energy section about two TFT that are included in an inverter will be explained as an example.

Figure 8:
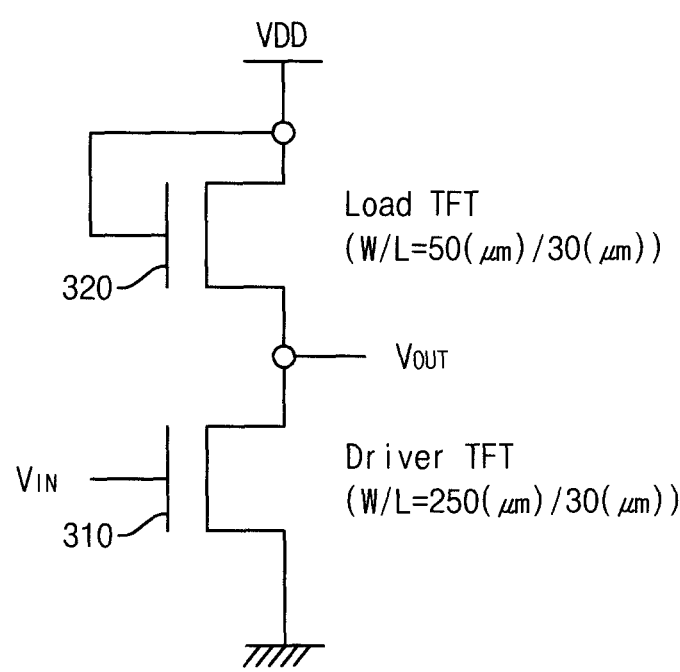
FIG. 8 is a circuit diagram illustrating an inverter including the amorphous semiconductor TFT.

FIG. 8 is a circuit diagram illustrating an inverter including the above-discussed amorphous semiconductor TFT.

Referring to FIG. 8, the inverter includes a driver TFT 310 and a load TFT 320. The driver TFT 310 and/or the load TFT

[Equation 10]

$$R_{SRH1}(E_t) = \sigma v_{th} N_t(E_t) \frac{(pn - n_i^2)}{p + n + p' + n'}$$

$$= \sigma v_{th} N_t(E_t) \frac{N_C N_V \exp\left(-\frac{E_g + qV'_{DS}}{kT}\right) - N_C N_V \exp\left(-\frac{E_{g,eff}}{kT}\right)}{N_C \exp\left(-\frac{E_C - (E_F - qV'_{DS}) - q\phi(x)}{kT}\right) + N_V \exp\left(-\frac{E_F - E_V - q\phi(x)}{kT}\right) + N_C \exp\left(-\frac{E_C - E_t}{kT}\right) + N_V \exp\left(-\frac{E_t - E_V}{kT}\right)} \; [s^{-1}cm^{-3}]$$

$$n_i^2 = N_C N_V \exp\left(-\frac{E_{g,eff}}{kT}\right)$$

$$V'_{DS} = V_{DS} - I_{DS} \times R_{SD} = V_{DS} - V_{IR}[V]$$

$N_t(E_t) = \int_{E_t}^{E_t + \Delta E} (g_A(E) + g_{TD}(E)) dE$ [cm$^{-3}$]   [Equation 11]

$R_{SRH1\_TOT} = \int_{E_V}^{E_C} R_{SHR1}(E_t) \delta(E_t) dE_t$ [s$^{-1}$cm$^{-3}$]

$J_{G-R1} = q \cdot \int_0^{TIGZO} R_{SHR1\_TOT} dx$ [A·cm$^{-2}$]   [Equation 12]

320 may include an amorphous semiconductor discussed above. The inverter converts a direct current $V_{DD}$ to an alternating current $V_{OUT}$ and outputs the alternating current $V_{OUT}$ according to an input voltage $V_{IN}$.

[Equation 13]

$$R_{SRH2}(E_t) = \sigma v_{th} N_{it}(E_t) \frac{np - n_i^2}{n + p + n' + p'}$$

$$= \sigma v_{th} N_{it}(E_t) \frac{N_C N_V \exp\left(-\frac{E_g + qV'_{DS}}{kT}\right) - N_C N_V \exp\left(-\frac{E_{g,eff}}{kT}\right)}{N_C \exp\left(-\frac{E_C - (E_F - qV'_{DS}) - q\phi(x)}{kT}\right) + N_V \exp\left(-\frac{E_F - E_V - q\phi(x)}{kT}\right) + N_C \exp\left(-\frac{E_C - E_t}{kT}\right) + N_V \exp\left(-\frac{E_t - E_V}{kT}\right)} \; [s^{-1}cm^{-2}]$$

$$n_i^2 = N_C N_V \exp\left(-\frac{E_{g,eff}}{kT}\right)$$

$$V'_{DS} = V_{DS} - I_{DS} \times R_{SD} = V_{DS} - V_{IR}[V]$$

$N_{it}(E_t) = \int_{E_t}^{E_t + \Delta E} D_{it}(E) dE$ [cm$^{-2}$]   [Equation 14]

$J_{G-R2} = q \cdot \int_{E_V}^{E_C} R_{SRH2}(E_t) \delta(E_t) dE_t$ [A·cm$^{-2}$]   [Equation 15]

$J_{G-R} = J_{G-R1} + J_{G-R2}$ [A·cm$^{-2}$]

$I_{G-R}(V_{GS}, V_{DS}) = -J_{G-R} \times W \times L$ [A]   [Equation 16]

If the set of calculated simulated values of $I_{G-R}$ is not equal to the set of measured values of $I_{G-R}$, the parameter controller 230 changes the parameter values of the state-density-functions $g_{TD}$, $g_{OV}$, and $D_{it}$ in step S160. The steps S110 to S170 are repeated until the set of calculated simulated values is equal to the set of measured values of $I_{G-R}$.

Figure 9A:
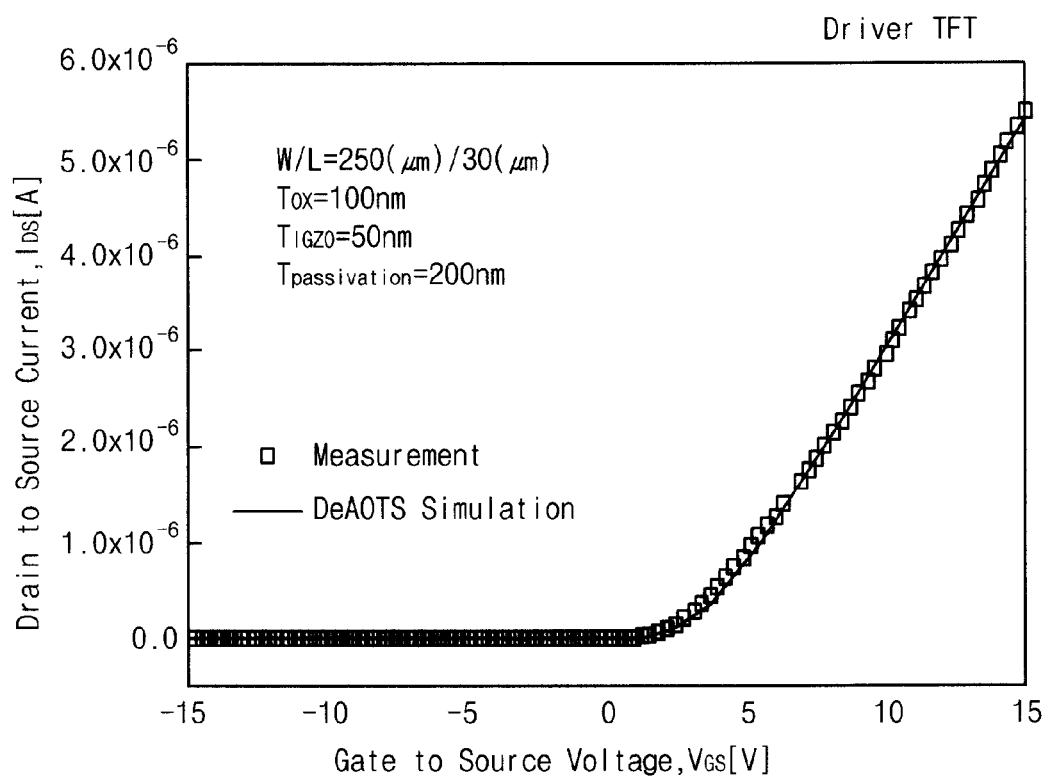
FIGS. 9A to 9E are graphs illustrating results of parameters by combining measured I-V properties of a driver TFT in FIG. 8 with a calculated I-V simulation.
Figure 9B:
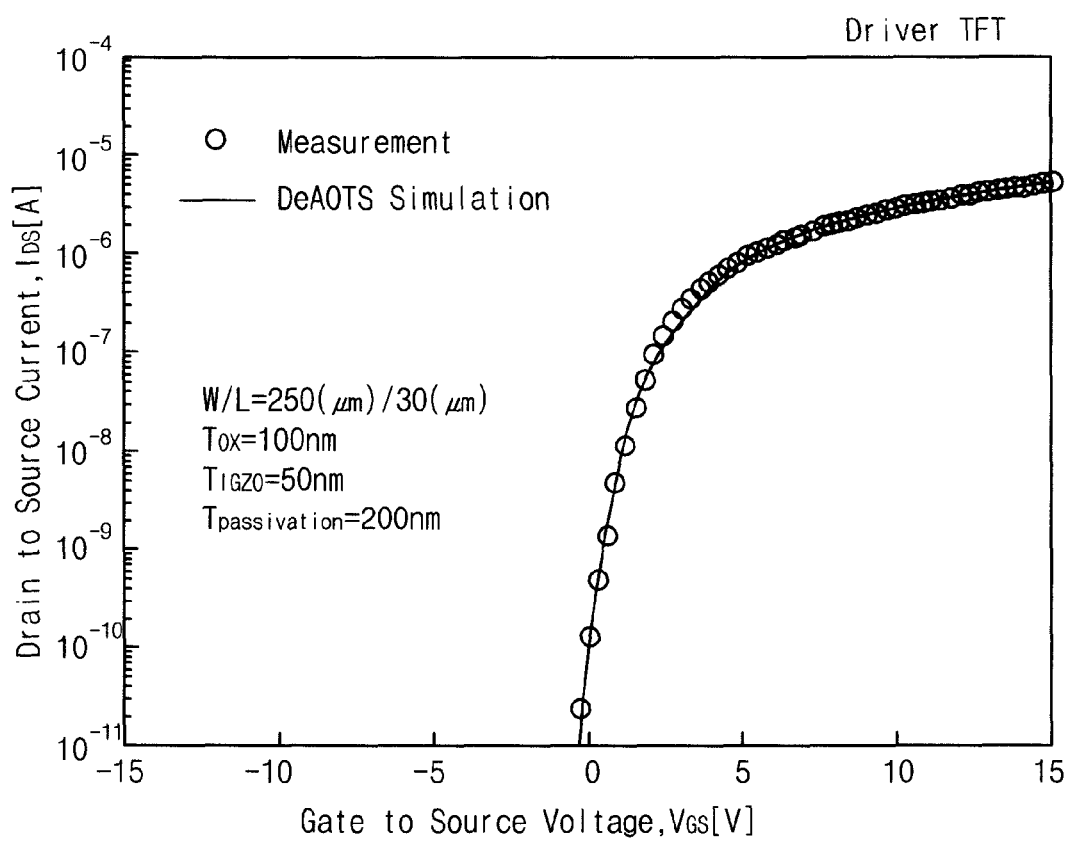
Figure 9C:
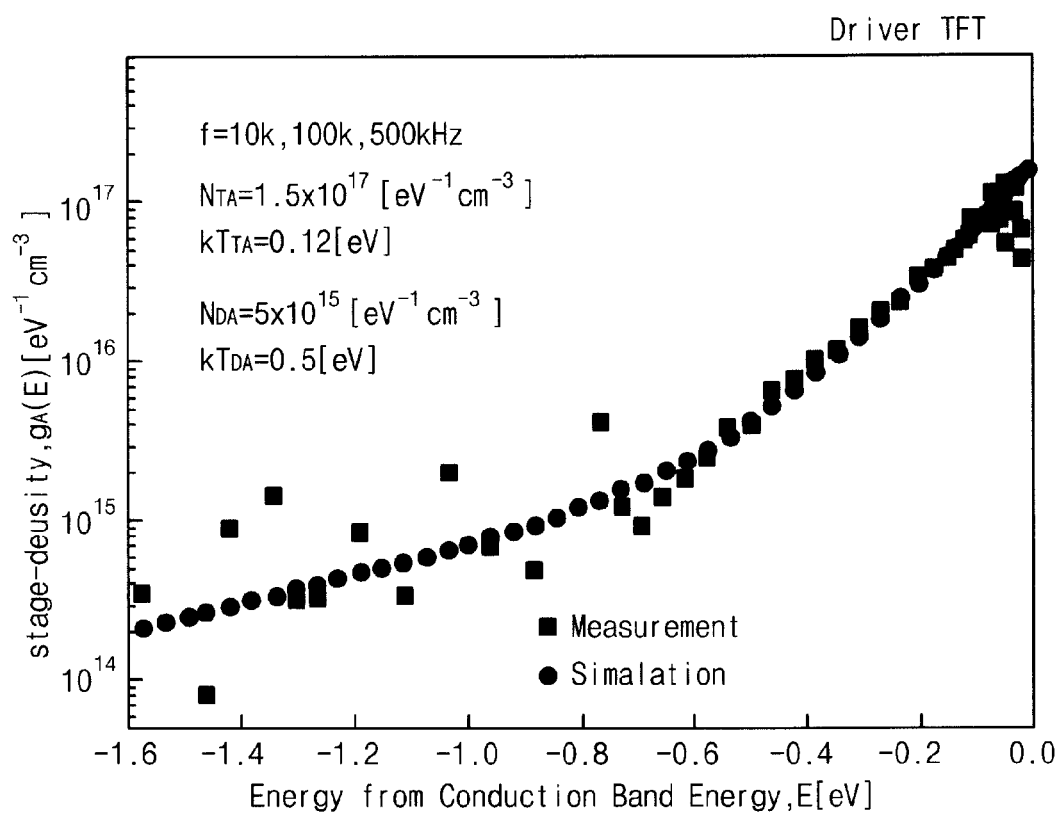
Figure 9D:
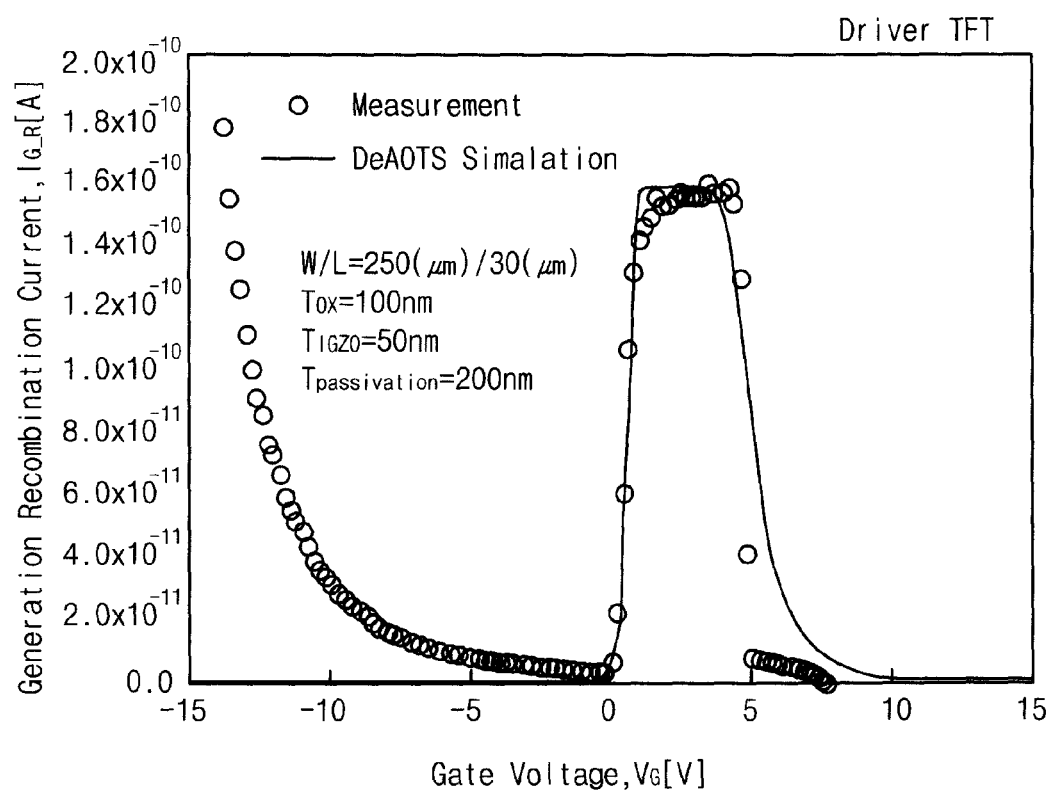
Figure 9E:
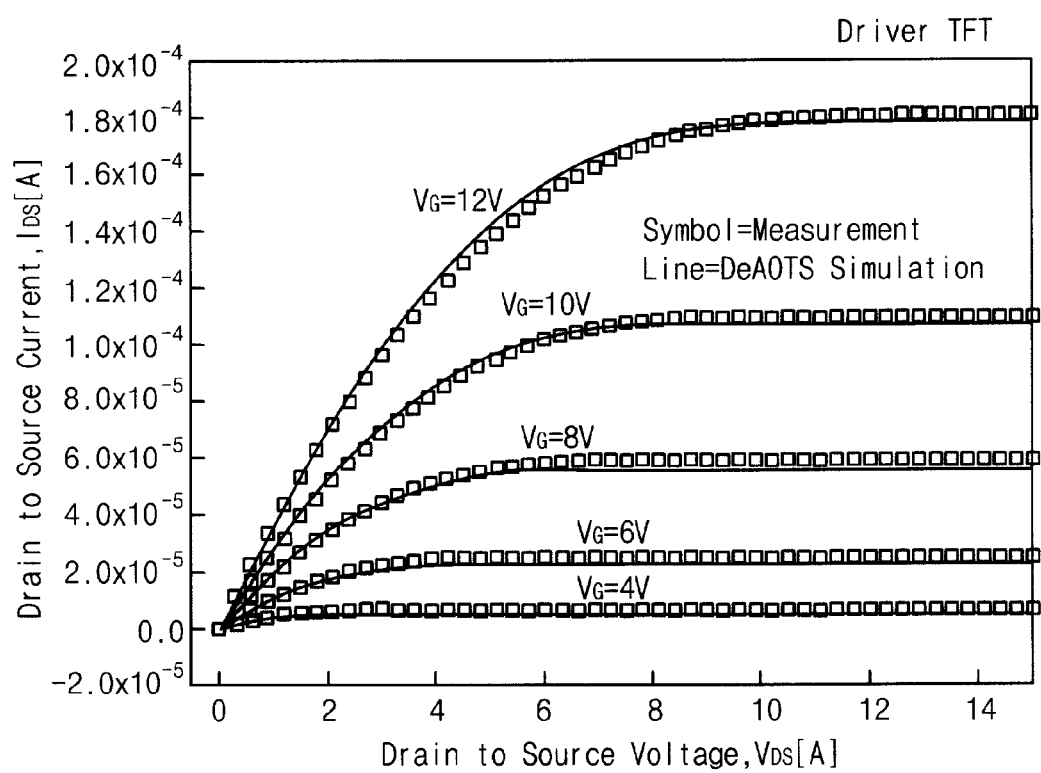

In the step 170, if the set of measured values of generation-recombination current $I_{G-R}$ is equal to the set of calculated FIGS. 9A, 9B, 9D and 9E are graphs illustrating results of parameters by combining a plot of measured I-V properties of the driver TFT 310 illustrated in FIG. 8 with a plot of calculated I-V values, the calculated I-V values being calculated using the method illustrated in FIG. 4. FIGS. 9A and 9B show the results on different scale of $V_{DS}$. FIG. 9C is a graph of energy and state-density illustrating determined parameters by comparing measured values and simulated values. Tpassivation is a thickness of a passivation layer.

Figure 10A:
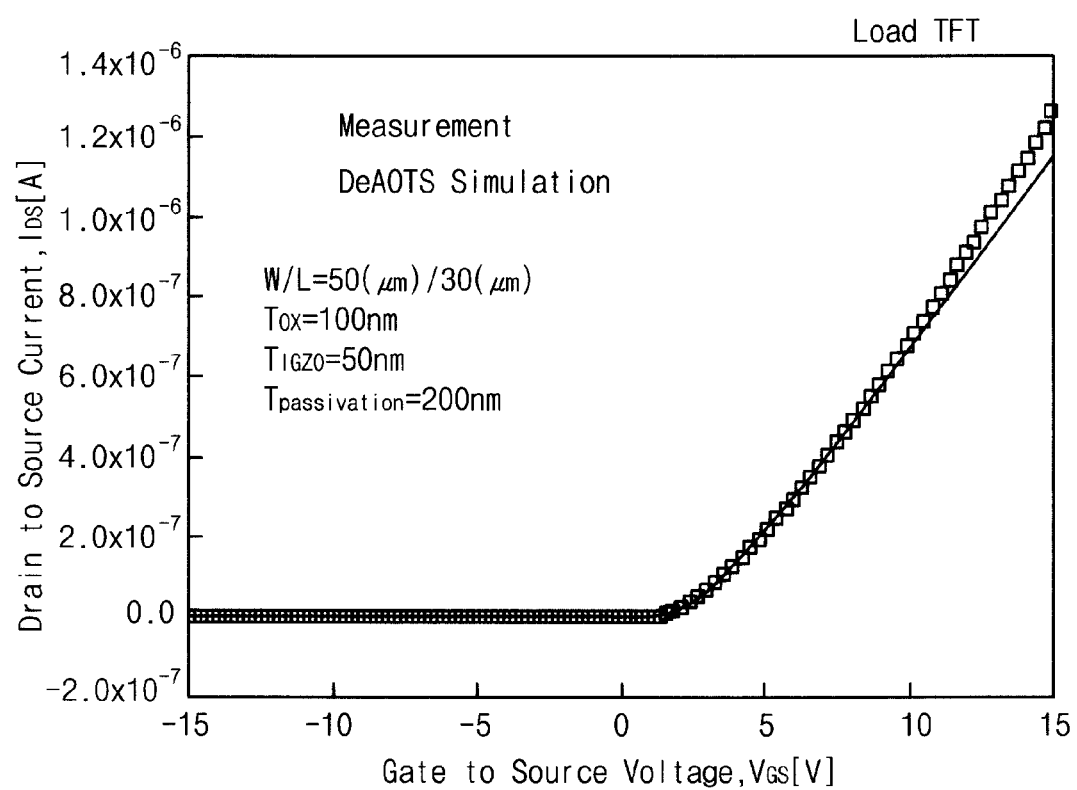
FIGS. 10A to 10E are graphs illustrating results of parameters by combining the measured I-V properties of a load TFT in FIG. 8 with the calculated I-V simulation, using the method illustrated in FIG. 4.
Figure 10B:
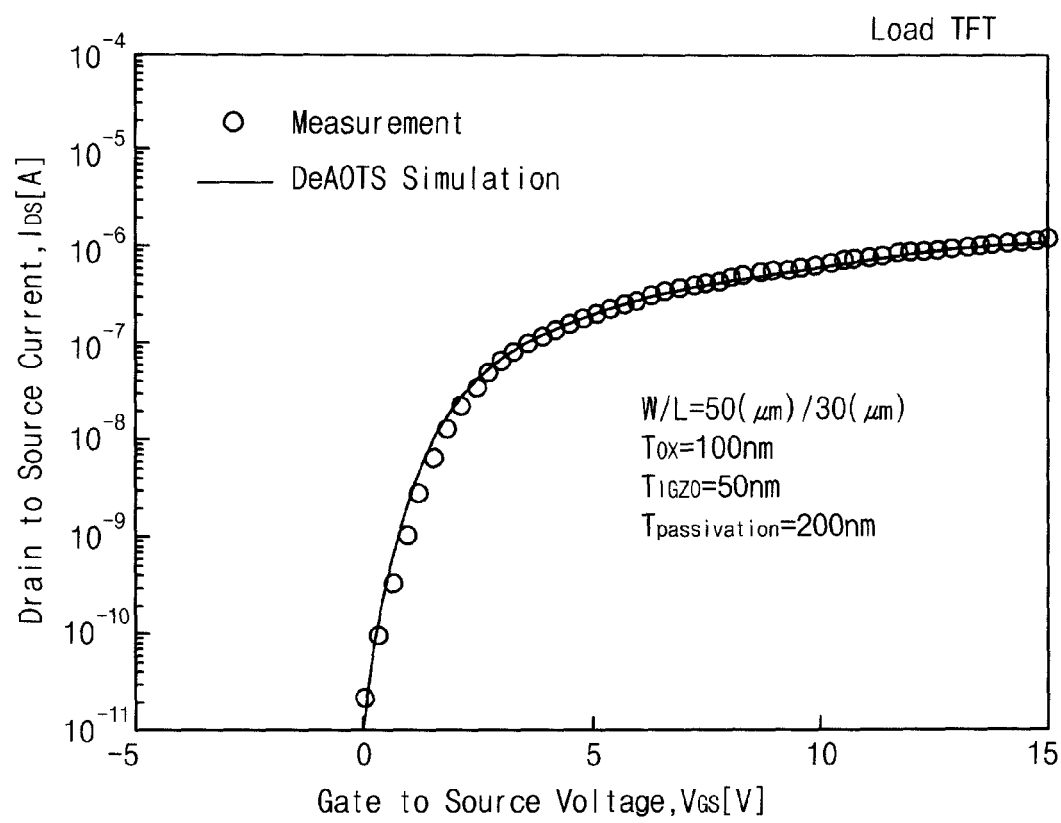
Figure 10C:
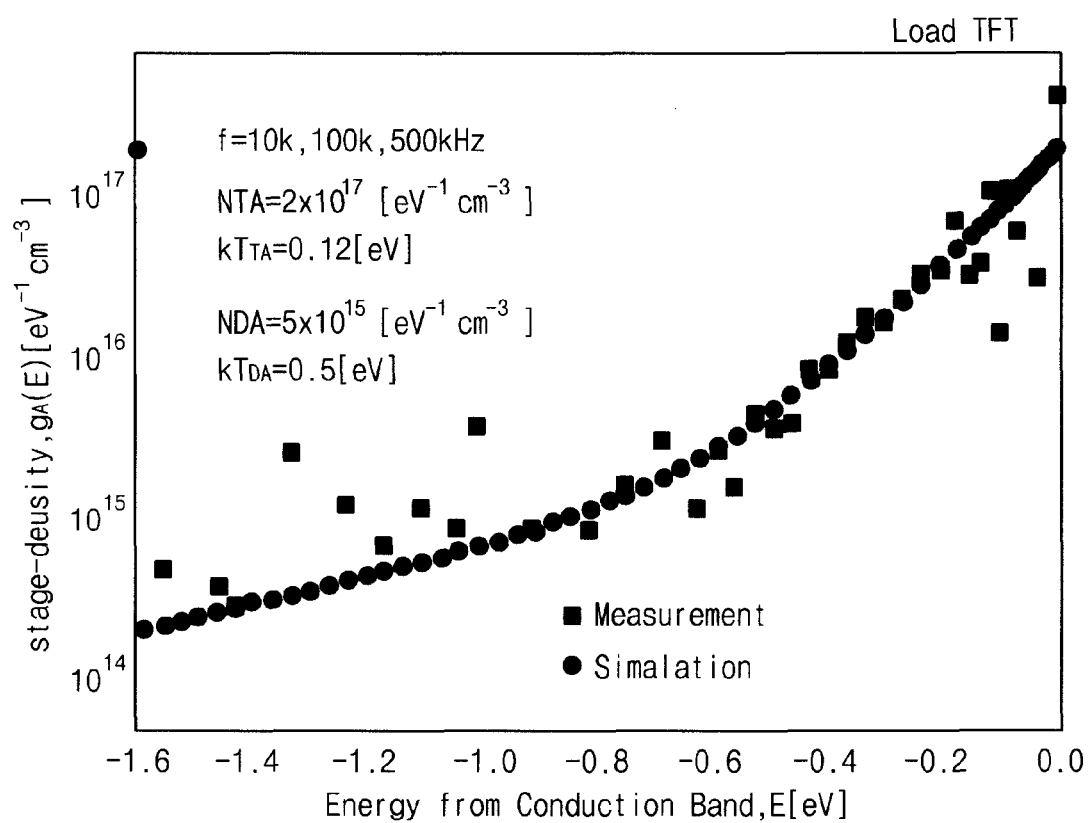
Figure 10D:
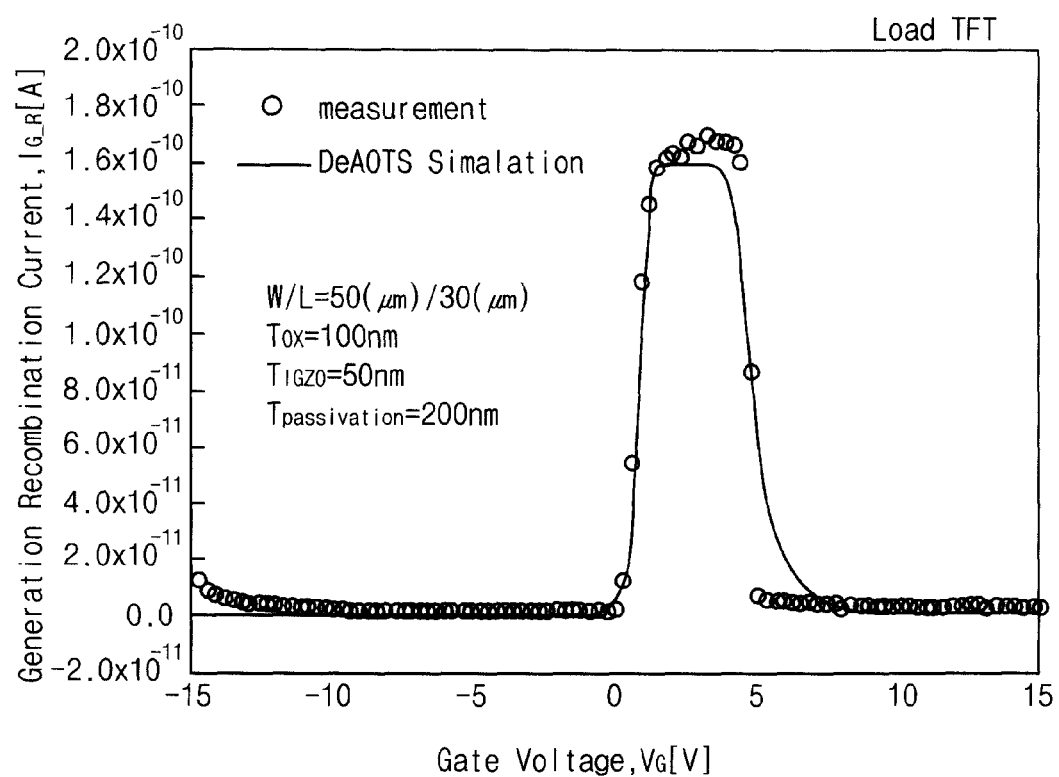
Figure 10E:
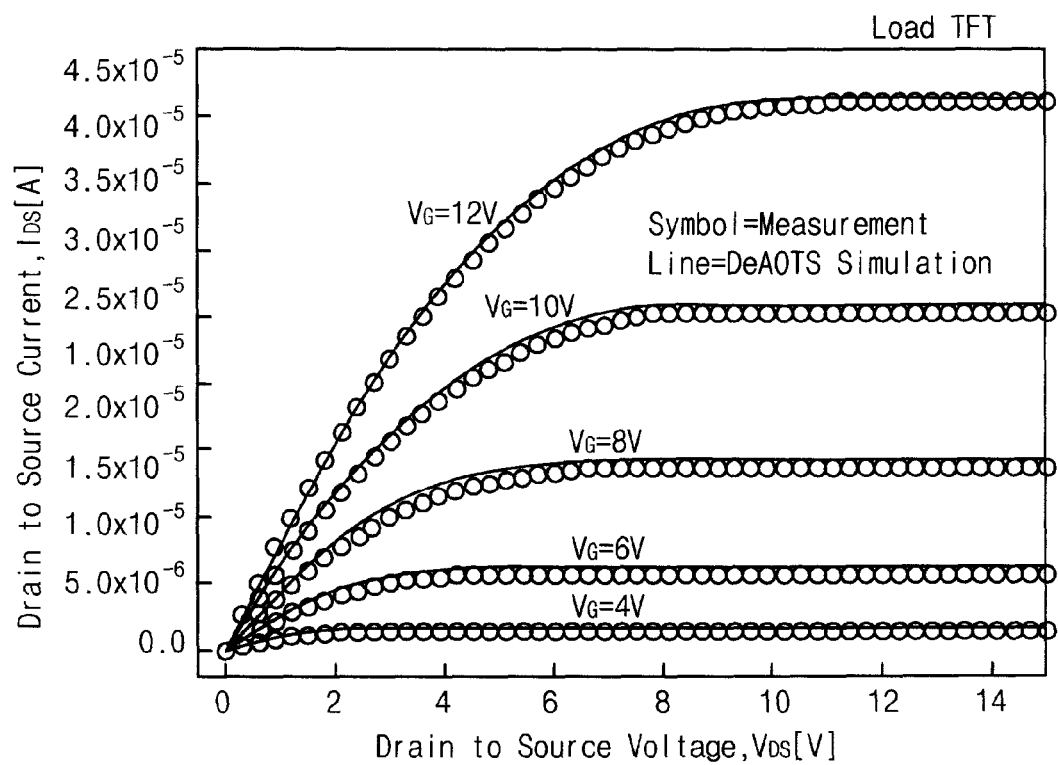

FIGS. 10A to 10E are graphs illustrating results of parameters by combining a plot the measured I-V properties of the load TFT 320 illustrated in FIG. 8 with a plot of calculated I-V values, the calculated I-V values being calculated using the method illustrated in in FIG. 4. FIGS. 10A and 10B show the results on different scale of $V_{DS}$. FIG. 10C is a graph of energy and state-density illustrating determined parameters by comparing measured values and simulated values.

Figure 11A:
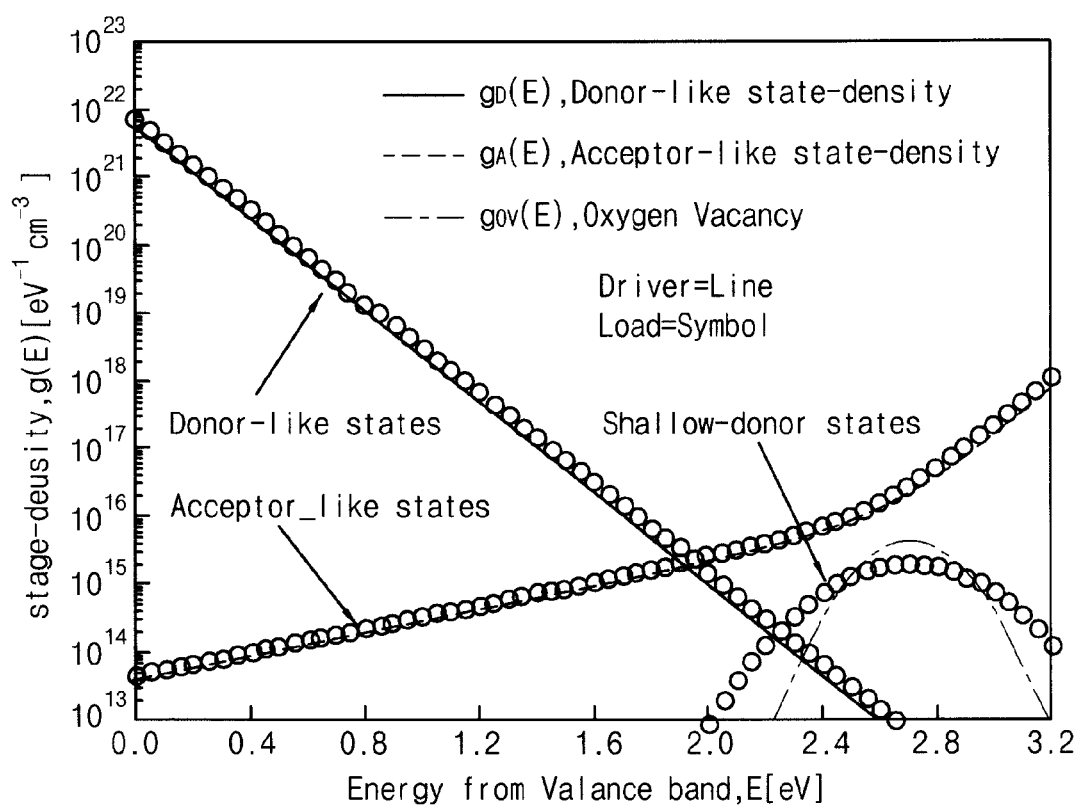
FIGS. 11A to 11B are graphs illustrating results calculating the state-density-function and the interfacial state-density-function of the entire energy band in the band gap of the TFTs illustrated in FIG. 8 using the method illustrated in FIG. 4.
Figure 11B:
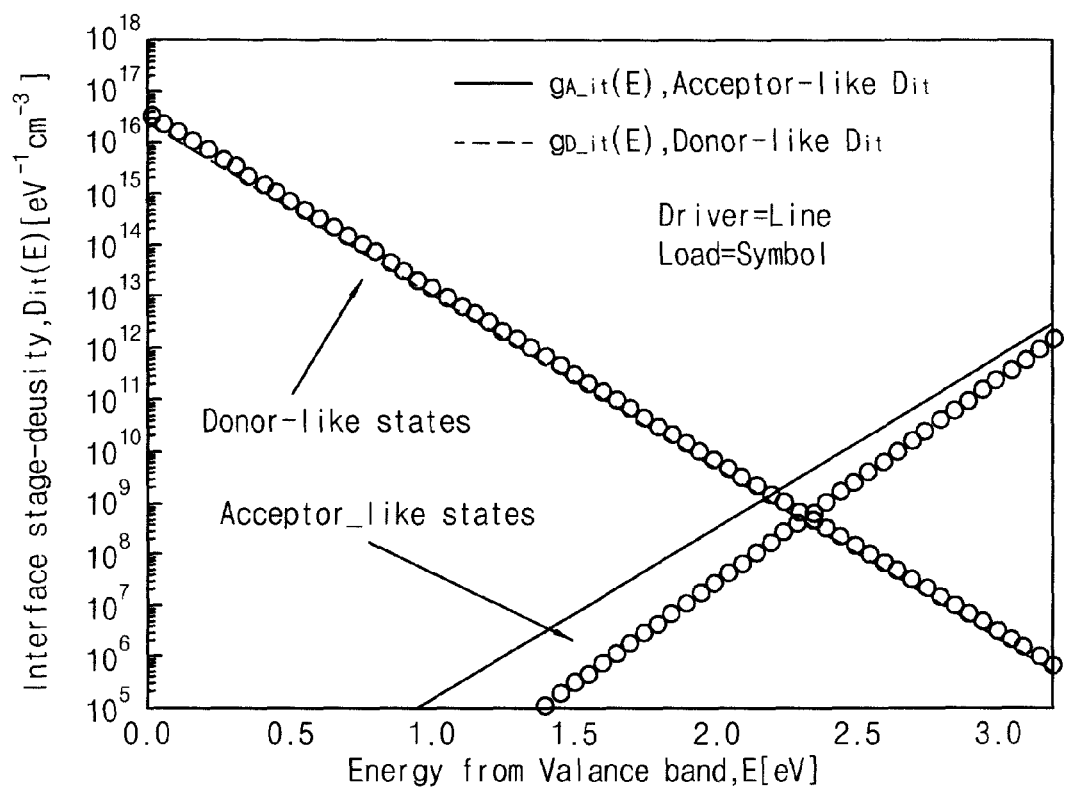
Figure 12A:
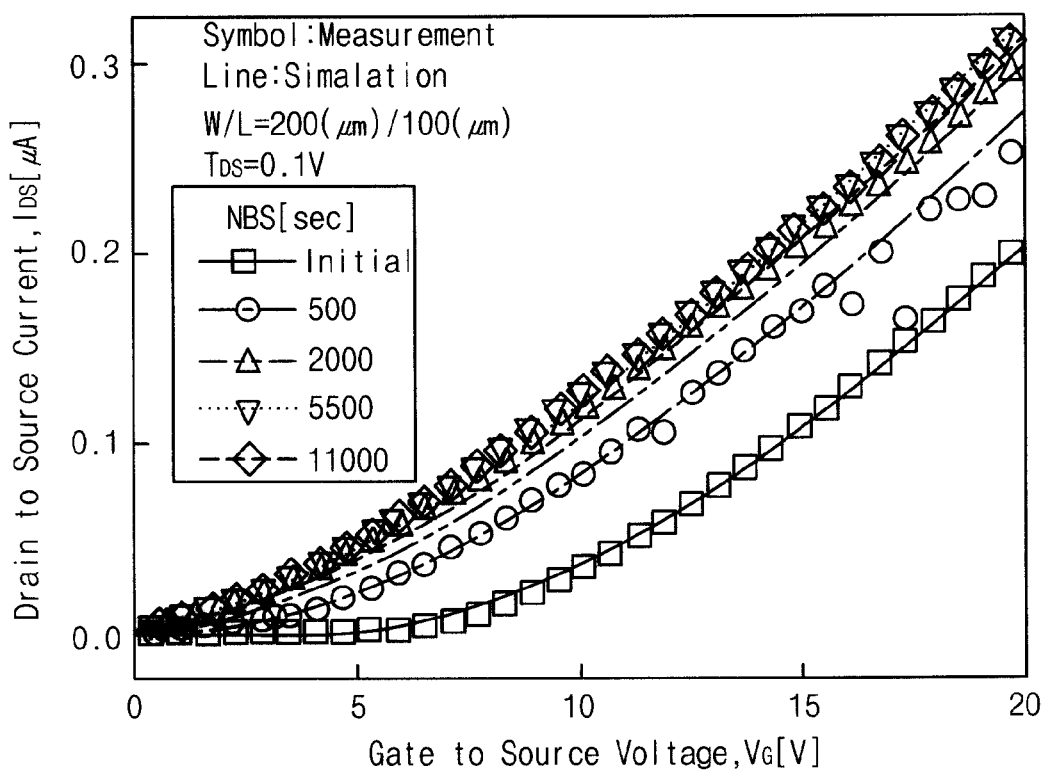
FIGS. 12A to 12F are graphs measuring changes of parameters calculated by the method in FIG. 4 according to lasting time under a negative voltage and an optical stress environment.
Figure 12B:
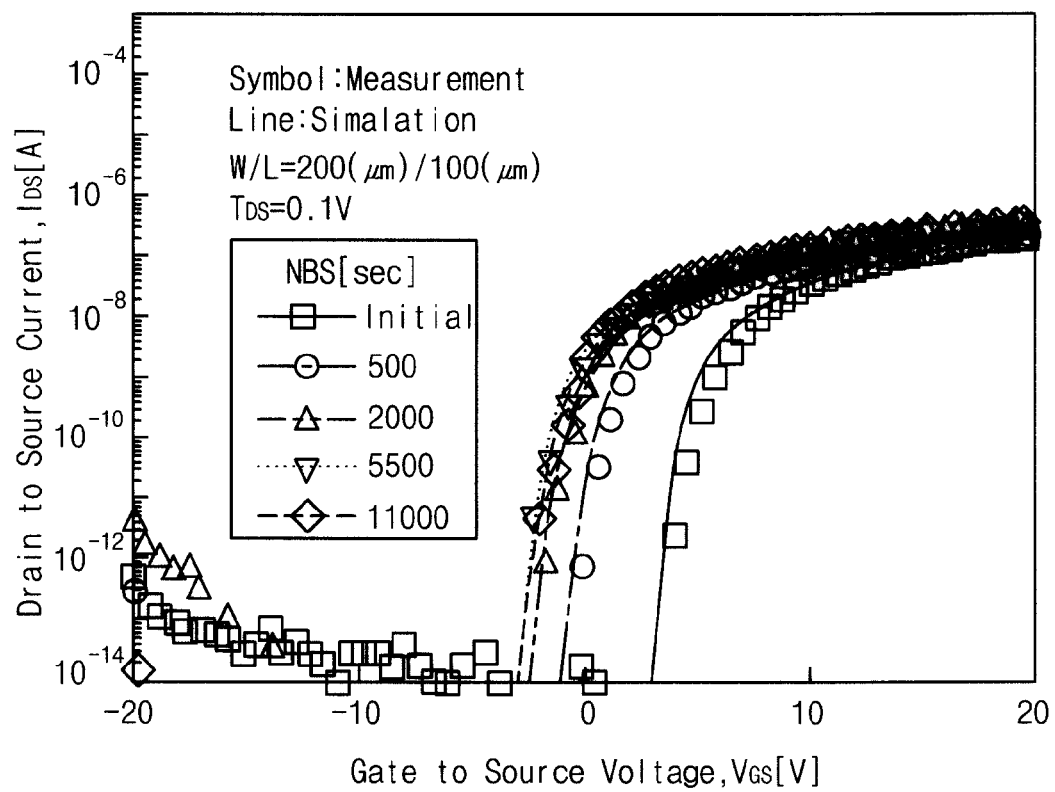
Figure 12C:
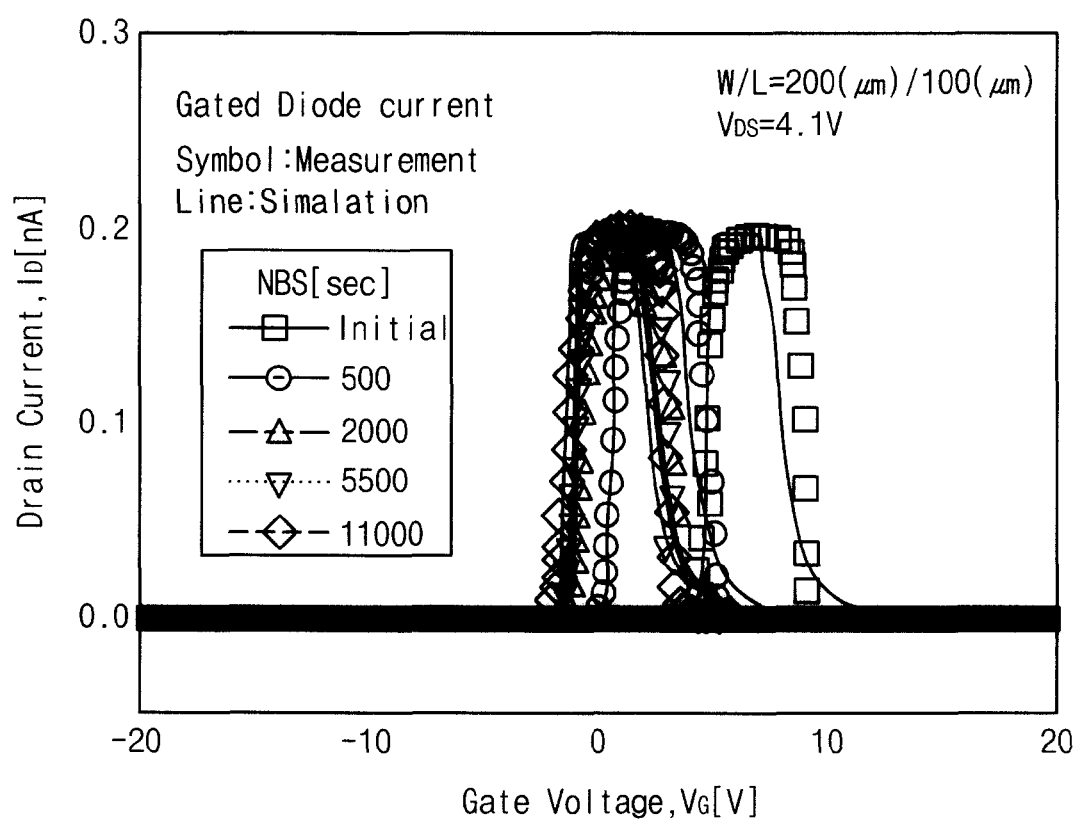
Figure 12D:
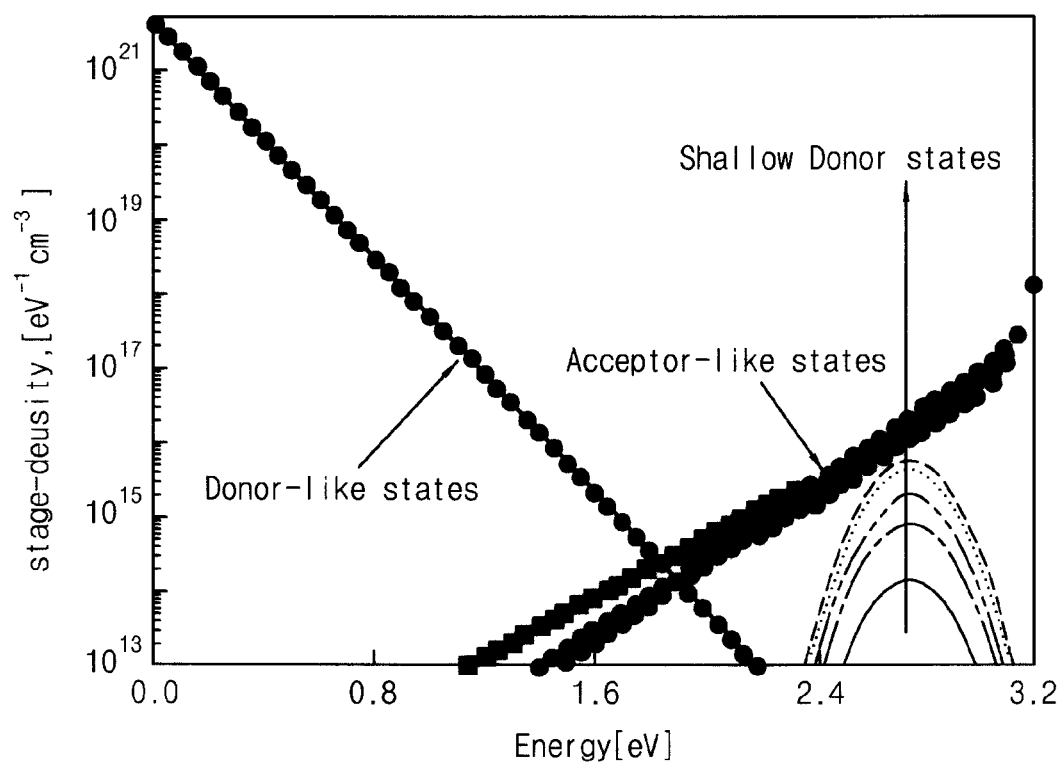
Figure 12E:
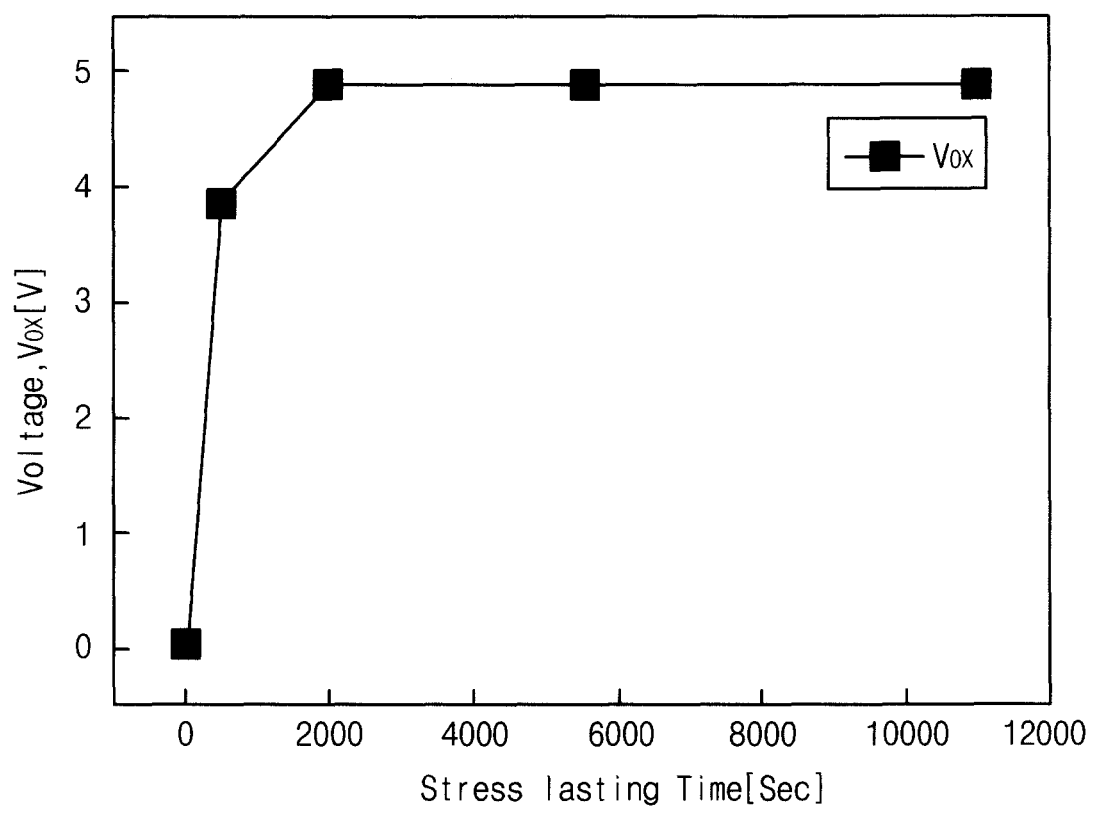
Figure 12F:
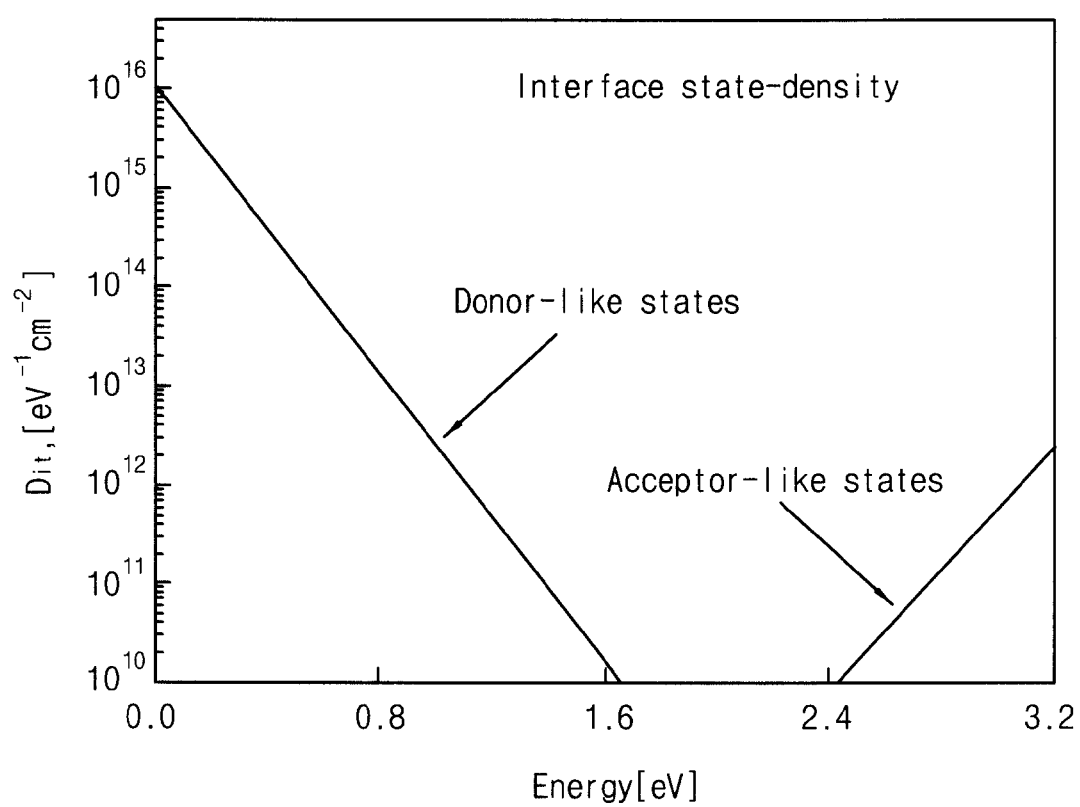

FIGS. 11A to 11B are graphs illustrating results of calculating the state-density-function and the interfacial state-density-function of the entire energy band in the band gap of the driver TFT 310 and the load TFT 320 illustrated in FIG. 8 using the method illustrated in FIG. 4.

Table 1 showing parameters and associated values used to obtain the state-density-function and the interfacial state-density-function illustrated in FIGS. 11A and 11B.

TABLE 1

| Parameter | Load TFT | Driver TFT |
|---|---|---|
| $N_{TA}$ | $2*10^{17}$ | $1.6*10^{17}$ |
|  | $[cm^{-3} \cdot eV^{-1}]$ | $[cm^{-3} \cdot eV^{-1}]$ |
| $kT_{TA}$ | $0.12[eV]$ | $0.12[eV]$ |
| $N_{DA}$ | $5*10^{15}$ | $5*10^{15}$ |
|  | $[cm^{-3} \cdot eV^{-1}]$ | $[cm^{-3} \cdot eV^{-1}]$ |
| $kT_{DA}$ | $0.5[eV]$ | $0.5[eV]$ |
| μBand | | $22.5[cm^2/V \cdot s]$ |
| $N_C$ | | $9*10^{17}[cm^{-3}]$ |
| $N_V$ | | $1*10^{14}[cm^{-3}]$ |
| $V_{FB}$ | $-2.1[V]$ | $-2.4[V]$ |
| $N_{TD}$ | $7*10^{21}$ | $5*10^{21}$ |
|  | $[cm^{-3} \cdot eV^{-1}]$ | $[cm^{-3} \cdot eV^{-1}]$ |
| $kT_{TD}$ | $0.13[eV]$ | $0.13[eV]$ |
| $N_{OV}$ | $2*10^{15}$ | $4.3*10^{15}$ |
|  | $[cm^{-3} \cdot eV^{-1}]$ | $[cm^{-3} \cdot eV^{-1}]$ |
| $kT_{OV}$ | $0.3[eV]$ | $0.2[eV]$ |
| $E_{OV}$ | $2.7[eV]$ | $2.7[eV]$ |
| $N_{TA\_it}$ | $1.5*10^{12}$ | $3.2*10^{12}$ |
|  | $[cm^{-2} \cdot eV^{-1}]$ | $[cm^{-2} \cdot eV^{-1}]$ |
| $kT_{TA\_it}$ | $0.11[eV]$ | $0.13[eV]$ |
| $N_{TD\_it}$ | $3.5*10^{16}$ | $2.5*10^{16}$ |
|  | $[cm^{-2} \cdot eV^{-1}]$ | $[cm^{-2} \cdot eV^{-1}]$ |
| $kT_{TD\_it}$ | $0.13[eV]$ | $0.13[eV]$ |

The state-density-function over the entire energy band in the band gap may be used to quantify I-V property changes according to electric/light/thermal stress time.

For an example of reliability simulation, FIGS. 12A to 12F are graphs showing changes of parameter values calculated using the method illustrated in FIG. 4 according to durations (in seconds) under a negative voltage and an optical stress environment. The graphs of FIGS. 12A and 12B have scales of $I_{DS}$ different each other.

Table 2 shows parameters and associated values that are used to obtain the state-density-function and the interfacial state-density-function in FIGS. 13A to 13F.

TABLE 2

| amorphous semiconductor $T_{IGZO}$ (In:Ga:Zn = 2:2:1) | |
|---|---|
| $N_C$ | 2.8E18 |
| $N_V$ | 1E14 |
| $V_{FB}$ | 1.4~-2.8 |
| $E_{FB}$ | LNBS Variation |
| $N_{TA}$ | |
| $kT_{TA}$ | |
| $N_{DA}$ | |
| $kT_{DA}$ | |
| $N_{TA\_it}$ | 2.9E12 |
| $kT_{TA\_it}$ | 0.13 |
| $N_{TD}$ | 4.5E21 |
| $kT_{TD}$ | 0.11 |
| $N_{OV}$ | 1.4E14~4.3E16 |
| $E_{OV}$ | 2.75 |
| $kT_{OV}$ | 0.15 |
| $n_i^2$ | 0.00325 |
| μBand | 8.7 |
| Qox | 0~-5[V] |

TABLE 2-continued

| amorphous semiconductor $T_{IGZO}$ (In:Ga:Zn = 2:2:1) | |
|---|---|
| $N_{TD\_it}$ | 2.25E16 |
| $kT_{TD\_it}$ | 0.11 |

Calculating the state-density-function and the interface state-density-function over the entire energy band in the band gap of the amorphous semiconductor TFT, methods and apparatuses according to one or more embodiments of the invention may determine relevant parameter values and may calculate changes of TFT electrical properties resulted from electric/light/thermal stresses.

According to embodiments of the invention, electrical property changes under electric/light/thermal stresses may be accurately simulated by calculating the state-density-function over the entire energy band in the band gap of the amorphous semiconductor TFT. Thus, values of reliability parameters for the simulation of the amorphous semiconductor TFT may be provided. The reliability is related to changes of electrical properties of the amorphous semiconductor TFT according to stress time in an electrical, light, and/or thermal stress environment. Advantageously, optimization of manufacturing processes and optimization of element structures may be achieved through simulating and predicting element performance and circuit properties.

In addition, according to embodiments of the invention, applying measured I-V and the generation-recombination current $I_{G-R}$ values of the TFT that change according to electrical, light, and/or thermal stress time, the state-density-function and values of various parameters may be calculated. Accordingly, electrical property changes according to electrical, light, and/or thermal stress time may be quantified and predicted.

The foregoing is illustrative of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific example embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A method for calculating values of parameters of a thin film transistor (TFT), the method comprising:
    calculating, using a computer, a set of simulated current-voltage (I-V) values using state-density-functions over an entire energy band in a band gap of an amorphous semiconductor of the TFT;
    comparing, using the computer, the set of simulated I-V values with a set of measured I-V values of the TFT to determine a value of a parameter of the TFT; and determining values of a donor state-density-function $g_D$ and values of an interface state-density-function $D_{it}$ over the entire energy band in the band gap.

2. The method of claim 1, further comprising:
calculating values of an acceptor state-density-function $g_A$ using a set of electrostatic capacity-voltage (C-V) values of the TFT measured according to a frequency of TFT.

3. The method of claim 2, wherein the acceptor state-density-function $g_A$ comprises an acceptor-like tail state-density-function and an acceptor-like deep state-density-function,
the donor state-density-function $g_D$ comprises a donor-like tail state-density-function $g_{TD}$ and a shallow donor state-density-function $g_{OV}$, and
the interface state-density-function $D_{it}$ comprises an acceptor-like state-density-function $D_{itA}$ and a donor-like state-density-function $D_{itD}$.

4. The method of claim 2, wherein in determining the value of the parameter of the TFT, values of a plurality of parameters of the state-density-functions applied for calculating the simulated I-V value are determined as the values of the parameters of the TFT when the set of simulated I-V values is equal to the set of measured I-V values.

5. The method of claim 4, further comprising controlling the donor state-density-function $g_D$ and the interface state-density-function $D_{it}$ to make the set of simulated I-V values become equal to the set of measured I-V values when the set of simulated I-V values is different from the set of measured I-V values.

6. The method of claim 4, further comprising:
calculating a set of simulated generation-recombination current ($I_{G-R}$) values using the state-density-functions when the set of simulated I-V values is equal to the set of measured I-V values.

7. The method of claim 6, wherein in determining the value of the parameter of the TFT,
values of a plurality of parameters of the state-density-functions applied for calculating the set of simulated $I_{G-R}$ values is determined as the values of the parameters of the TFT when the set of simulated $I_{G-R}$ values is equal to a set of measured $I_{G-R}$ values.

8. The method of claim 6, further comprising controlling the donor state-density-function $g_D$ and the interface state-density-function $D_{it}$ make the set of simulated $I_{G-R}$ values become equal to a set of measured $I_{G-R}$ values when the set of simulated $I_{G-R}$ values is different from the set of measured $I_{G-R}$ values.

9. A method for calculating values of parameters of a thin film transistor (TFT), the method comprising:
calculating, using a computer, a set of simulated current-voltage (I-V) values using state-density-functions over an entire energy band in a band gap of an amorphous semiconductor of the TFT; and
comparing, using the computer, the set of simulated I-V values with a set of measured I-V values of the TFT to determine a value of a parameter of the TFT, wherein calculating the set of simulated current-voltage (I-V) values comprises:
calculating a flat band voltage ($V_{FB}$) using the state-density-functions in a flat band condition;
calculating a density of an electrical charge, an electric field, and an electric potential of the amorphous semiconductor using the flat band voltage; and
calculating a subset of simulated I-V values using the density of the electrical charge, the electric field, and the electric potential.

10. A calculating apparatus for calculating values of parameters of a TFT, the calculating apparatus comprising:
a calculating part calculating a set of simulated I-V values using state-density-functions over an entire energy band in a band gap of an amorphous semiconductor of the TFT;
a determining part comparing the set of simulated I-V values with a set of measured I-V values of the TFT to determine values of a plurality of parameters of the TFT;
a non-transitory storage medium storing computer readable code that is configured for performing tasks related to at least one of the calculating part and the determining part; and
a parameter controller determining values of a donor state-density-function $g_D$ and values of an interface state-density-function $D_{it}$ over the entire energy band in the band gap,
wherein the calculating part calculates the set of simulated I-V values using an acceptor state-density-function $g_A$, the donor state-density-function $g_D$, and the interface state-density-function $D_{it}$.

11. The calculating apparatus of claim 10, wherein the calculating part calculates values of an acceptor state-density-function $g_A$ using a set of electrostatic capacity-voltage (C-V) values of the TFT measured according to a frequency of TFT.

12. The calculating apparatus of claim 11, wherein the acceptor state-density-function $g_A$ comprises an acceptor-like tail state-density-function and an acceptor-like deep state-density-function,
the donor state-density-function $g_D$ comprises an donor-like tail state-density-function $g_{TD}$ and an shallow donor state-density-function $g_{OV}$, and
the interface state-density-function $D_{it}$ comprises an acceptor-like state-density-function $D_{itA}$ and a donor-like state-density-function $D_{itD}$.

13. The calculating apparatus of claim 11, wherein the determining part determines values of a plurality of parameters of the state-density-functions applied for calculating the simulated I-V value as the values of the parameters of the TFT when the set of simulated I-V values is equal to the set of measured I-V values.

14. The calculating apparatus of claim 13, wherein the parameter controller controls the donor state-density-function $g_D$ and the interface state-density-function $D_{it}$ to make the set of simulated I-V values become equal to the set of measured I-V values when the set of simulated I-V values is different from the set of measured I-V values.

15. The calculating apparatus of claim 13, wherein the calculating part calculates a set of simulated $I_{G-R}$ values of the TFT using the state-density-functions when the set of simulated I-V value is equal to the set of measured I-V values.

16. The calculating apparatus of claim 15, wherein the determining part determines values of a plurality of parameters of the state-density-functions applied for calculating the set of simulated $I_{G-R}$ values as the values of the parameters of the TFT when the set of simulated $I_{G-R}$ values is equal to a set of measured $I_{G-R}$ values.

17. The calculating apparatus of claim 15, wherein the parameter controller controls the donor state-density-function $g_D$ and the interface state-density-function $D_{it}$ to make the set of simulated $I_{G-R}$ values become equal to a set of measured $I_{G-R}$ values, when the simulated $I_{G-R}$ value is different from the set of measured $I_{G-R}$ values.

18. The calculating apparatus of claim 10, wherein the calculating part calculates a flat band voltage ($V_{FB}$) using the state-density-functions in a flat band condition, calculates a density of an electrical charge, an electric field, and an electric potential using the flat band voltage ($V_{FB}$), and calculates a subset of I-V values using the density of the electrical charge, the electric field, and the electric potential.

* * * * *